United States Patent
Sasaki et al.

(10) Patent No.: US 7,859,666 B2
(45) Date of Patent: Dec. 28, 2010

(54) ELECTRIC FIELD SENSOR

(75) Inventors: Aiichirou Sasaki, Tokyo (JP); Mitsuru Shinagawa, Tokyo (JP); Nobutarou Shibata, Tokyo (JP); Tadashi Minotani, Tokyo (JP); Kazuo Fujiura, Tokyo (JP); Masahiro Sasaura, Tokyo (JP); Seiji Toyoda, Tokyo (JP)

(73) Assignee: Nippon Telegraph and Telephone Corporation (JP)

( * ) Notice: Subject to any disclaimer, the term of this patent is extended or adjusted under 35 U.S.C. 154(b) by 724 days.

(21) Appl. No.: 10/527,790

(22) PCT Filed: Jul. 28, 2004

(86) PCT No.: PCT/JP2004/010716
§ 371 (c)(1),
(2), (4) Date: Jan. 6, 2006

(87) PCT Pub. No.: WO2005/015247
PCT Pub. Date: Feb. 17, 2005

(65) Prior Publication Data
US 2006/0152209 A1 Jul. 13, 2006

(30) Foreign Application Priority Data

| Jul. 28, 2003 | (JP) | 2003-281010 |
| Nov. 10, 2003 | (JP) | 2003-380400 |
| Nov. 10, 2003 | (JP) | 2003-380407 |
| Nov. 10, 2003 | (JP) | 2003-380432 |
| Mar. 30, 2004 | (JP) | 2004-100254 |
| Apr. 7, 2004 | (JP) | 2004-113083 |

(51) Int. Cl.
G01R 29/08 (2006.01)
G01J 4/04 (2006.01)

(52) U.S. Cl. .............. 356/368; 250/227.14; 324/753

(58) Field of Classification Search .......... 356/365, 356/368
See application file for complete search history.

(56) References Cited

U.S. PATENT DOCUMENTS 5,263,102 A * 11/1993 Hakogi ............... 385/2
5,789,846 A * 8/1998 Brown ............... 310/366
6,496,013 B1 * 12/2002 Buks et al. ........... 324/538

(Continued)

FOREIGN PATENT DOCUMENTS

GB 1353543 5/1974

(Continued)

OTHER PUBLICATIONS

Cecelja et al. "Electro-Optic Sensor for Measurement of DC Fields in the Presence of Space Charge", IEEE Transactions on Instrumentation and Measurement, IEEE Service Center, vol. 61, No. 2, Apr. 2002.

*Primary Examiner*—Gregory J Toatley
*Assistant Examiner*—Rebecca C Slomski
(74) *Attorney, Agent, or Firm*—Kilpatrick Stockton LLP

(57) ABSTRACT

The present invention relates to an electric field sensor including: a light source (1); an electro optic crystal (7) which is applied with an electric field based on a signal under test, in which a birefringent index changes according to the electric field, and which changes a polarization state of light incident from the light source according to the birefringent index and emits the light; and a detector (9, 17, 19, 21) that detects an electric signal according to the change of the polarization state of the light emitted from the electro optic crystal (7). Further, the electric field sensor includes: a signal electrode (11) for applying the electric field based on the signal under test to the electro optic crystal (7); a counter electrode (12) that forms a pair with the signal electrode (11); and an auxiliary electrode (61) that is electrically connected to the counter electrode (12), and that forms a capacitance with ground.

7 Claims, 29 Drawing Sheets

U.S. PATENT DOCUMENTS

| | | | |
|---|---|---|---|
| 6,522,456 B2 * | 2/2003 | Chen et al. | 359/322 |
| 6,624,644 B2 * | 9/2003 | Ito et al. | 324/753 |
| 2004/0227942 A1 * | 11/2004 | Law et al. | 356/364 |

FOREIGN PATENT DOCUMENTS

| JP | 02-227620 A | 9/1990 |
|---|---|---|
| JP | 10-132865 A | 5/1998 |
| JP | 10-132866 | 5/1998 |
| JP | 2000-171488 A | 6/2000 |
| JP | 2001-324525 A | 11/2001 |
| JP | 2003-098204 | 4/2003 |
| JP | 2003-098205 A | 4/2003 |

* cited by examiner

FIG. 2 PRIOR ART
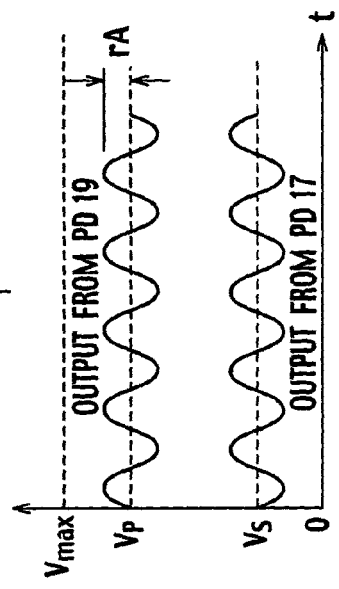
(a)
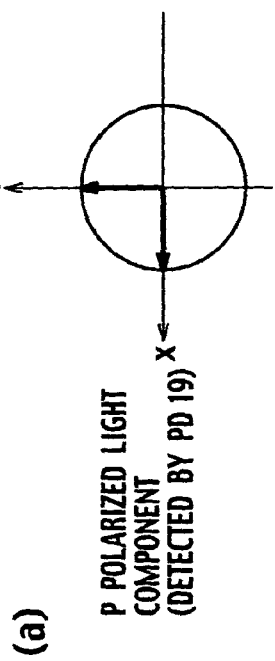
(b)
(c)
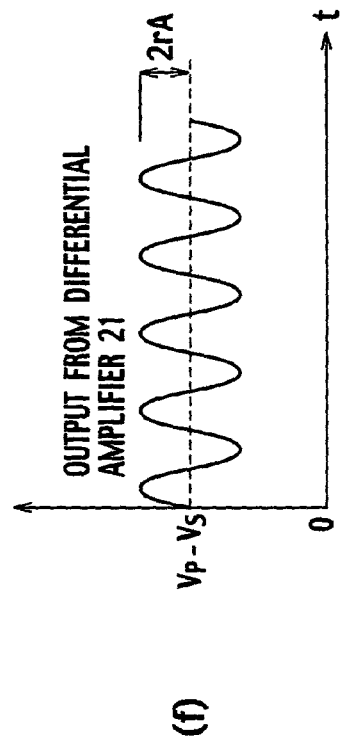
(d)
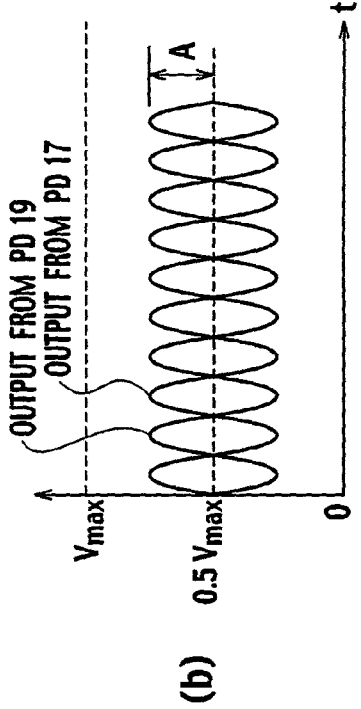
(e)
(f)

ELECTRIC FIELD SENSOR

TECHNICAL FIELD

The present invention relates to an electric field sensor that irradiates laser light to an electro optic crystal (hereinafter referred to as an "EO crystal") to which an electric field to be measured is applied and that measures field intensity of the applied electric field by detecting the laser light, and a method of adjusting the electric field sensor.

BACKGROUND ART

An electric field sensor that utilizes an EO effect inputs an optical beam to an EO crystal to which an alternate current electric field is applied, makes a polarizing beam splitter (hereinafter referred to as a "PBS") split the light output from the EO crystal into an S polarized light and a P polarized light, and makes two photo detectors (hereinafter referred to as "PDs") independently detect the respective polarized lights. A differential amplifier detects a difference between intensities of the polarized lights.

Immediately before the optical beam is incident to the PBS, the optical beam is desirably a circularly polarized light. Main advantages of the circularly polarized light are listed below.
(1) Intensity modulation of the optical beam becomes a maximum, which contributes to a highly sensitive detection of a differential signal. Based on a detection of the differential signal, the amplitude of an output signal from the PD can be amplified to a double.
(2) Based on a detection of the differential signal, intensity noise of the optical beam can be reduced, which contributes to a highly sensitive detection of the differential signal.
(3) Based on a detection of the differential signal, a direct current component of the signal can be offset, which contributes to a reduction in the load of a signal processing circuit.

FIG. 1 is an explanatory diagram of the operation of a conventional electric field sensor.

An optical beam 3 emitted from a light source 1 passes through a quarter wave plate (hereinafter referred to as a "QWP") 5 and an EO crystal 7, and is incident to a PBS 9. The QWP 5 adjusts the polarization state of the optical beam 3 such that the polarized light becomes a circularly polarized light immediately before the optical beam is incident to the PBS 9. An alternate current electric field corresponding to an alternate current signal under test 15 is applied to the EO crystal 7 via a signal electrode 11 and a ground electrode 13. The optical beam 3 is modulated in a polarizing manner within the EO crystal 7 according to the electric field. The PBS 9 splits the modulated light into S and P polarized light components. In this case, each polarized light component is converted into an intensity-modulated light. The intensity-modulated S and P polarized light components change in mutually reversed phases, and PDs 17 and 19 receive the output lights. A differential amplifier 21 detects a differential signal, thereby making it possible to obtain an output signal 22 in higher sensitivity.

FIGS. 2(a) to 2(f) are diagrams showing a relationship between a polarization state of an optical beam incident to the PBS 9 and an electric signal corresponding to the polarization state.

As shown in FIG. 2(a), when the polarization state of the optical beam that is incident to the PBS 9 is kept as a circularly polarized light, the intensities of the S and the P polarized light components obtained by splitting the optical beam by the PBS 9 are equal.

As shown in FIG. 2(b), when the polarization state of the optical beam that is incident to the PBS 9 is kept as a circularly polarized light, the electric signals output from the PDs 17 and 19 become signals corresponding to signals under test (in this case, sinusoidal waves) using 0.5 Vmax (where Vmax is an output voltage of the PD corresponding to a total amount of light) as a reference value. These signals mutually change in reversed phases. Maximum amplitude of each signal is set as A.

As shown in FIG. 2(c), when the polarization state of the optical beam that is incident to the PBS 9 is kept as a circularly polarized light, maximum amplitude of an output signal from the differential amplifier 21 becomes 2A, and a direct current component is offset. In this case, optical intensity noise included in the output signals from the PDs 17 and 19 is reduced substantially.

The above technique is disclosed in, for example, Japanese Patent Application Laid-Open Nos. 2003-98205 and 2001-324525.

However, as shown in FIG. 2(d), when the optical beam that is incident to the PBS 9 is not kept as a circularly polarized light but is in an elliptically polarized light, unbalance occurs in the intensities of the S and the P polarized light components obtained by splitting the optical beam by the PBS 9. This is mainly due to a temperature change.

As shown in FIG. 2(e), when the optical beam that is incident to the PBS 9 is in an elliptically polarized light, unbalance occurs in the direct current component of electric signals output from the PDs 17 and 19 (Vs≠Vp, and Vs+Vp=Vmax). As compared with the state shown in FIG. 2(b), a signal amplitude rA becomes smaller (rA, 0≦r<1).

As shown in FIG. 2(f), when the optical beam that is incident to the PBS 9 is an elliptically polarized light, a direct current component (Vp−Vs) remains in the electric signal output from the differential amplifier 21. The amplitude becomes 2rA, which is smaller than that shown in FIG. 2(c). In this case, the optical intensity noise included in the output signals from the PDs 17 and 19 cannot be reduced sufficiently.

When there is a temperature change, it is difficult for the optical beam immediately before being incident to the PBS 9 to maintain always as a circularly polarized light as the polarization state.

As explained above, because the optical beam changes to an elliptically polarized light in the electric field sensor, the following disadvantages arise.
(1) Since the intensity modulation of the optical beam decreases, the sensitivity of the sensor decreases.
(2) Unbalance occurs in the average intensity of the S and the P polarized light components. Laser intensity noise cannot be sufficiently reduced by detecting a differential signal. Therefore, the sensitivity as the sensor decreases.
(3) A direct current component of a signal cannot be sufficiently decreased by detecting a differential signal.

An undesirable reflected light in the above electric field sensor is explained next.

FIG. 3 is a diagram showing a configuration of an electric field sensor similar to that shown in FIG. 1, particularly focusing on the reflected light based on the polarization state. In FIG. 3, the electrodes 11 and 13 are omitted.

In an electric field sensor 101, a P polarized light 108 is irradiated from the laser light source 1. The P polarized light 108 is converted into a circularly polarized light 109 by the QWP 5.

The EO crystal 7 modulates the circularly polarized light 109 in a polarizing manner. The PBS 9 splits the modulated light into a P polarized light (component) 110 and an S polarized light (component) 111. The PD 19 receives the P polarized light 110, and converts this light into an electric signal. On the other hand, the PD 17 receives the S polarized light 111, and converts this light into an electric signal. The differential amplifier 22 or the like shown in FIG. 1 differentially amplifies these electric signals. An electric field is measured based on the differentially amplified result.

In the following explanations, the EO crystal 7, the PBS 9, and the PDs 17 and 19 are collectively called a reflection element 107, for the sake of convenience. Details of the reflection element 107 are described later.

FIG. 4 is a diagram for explaining the problems of the above electric field sensor 101 to be solved.

As described above, a circularly polarized light is incident to the EO crystal 7 in the electric field sensor 101. Each device including the EO crystal 7 constituting the reflection element reflects the incident light. The reflected light becomes a reflection return light 112, which is converted into an S polarized light 113 by the QWP 5. When the reflection return light (S polarized light) 113 is reversely incident to the laser light source 1, this can affect the measurement precision of the electric field sensor 101.

A reflected light can easily be generated on a light receiving surface of the PD, not to mention on the end surface of the EO crystal. When the reflected light on the light receiving surface of the PD is reversely incident to the laser light source 1, this can also affect the measurement precision of the electric field sensor 101.

The above electric field sensor is also applied to a detector of an electric signal that is transmitted through a human body as shown in FIG. 5, and a detector of an electric signal in a device under test (hereinafter referred to as a "DUT") as shown in FIG. 6 (refer to Japanese Patent Application Laid-Open No. 2000-171488).

As shown in FIG. 5, a receiving electrode RP is in contact with a measured point of a human body 100. When an electric signal is input to the receiving electrode RP from a signal source Sin via a transmitting electrode SP and the human body 100, a signal electrode 11 within the electric field sensor connected to the receiving electrode RP with a lead wire has the same potential as that of the measured point.

As shown in FIG. 6, a metal needle MN is in contact with a measured point of a DUT 201. When an electric signal is input to the metal needle MN from the signal source Sin via the DUT 201, the signal electrode 11 within the electric field sensor connected to the metal needle MN with the lead wire LD has the same potential as that of the measured point.

The subsequent operations are the same in FIG. 5 and in FIG. 6. First, an electric field is generated between the signal electrode 11 and the ground. In this case, a part of lines of electric force passes through the EO crystal 7, thereby generating an electric field within the EO crystal 7, as shown in FIG. 5 and FIG. 6.

When the electric field is generated within the EO crystal 7, a birefringent index changes within the EO crystal 7 according to the electric field. When a circularly polarized light is incident directly from the light source 1 or via the QWP 5 to the EO crystal 7 in which a birefringent index changes, an elliptically polarized light is output from the EO crystal 7. The elliptically polarized light is reflected from two mirrors 14a and 14b, and the reflected light is incident to the PBS 9. The PBS 9 splits the light into two linearly polarized lights (S and P polarized lights). The two PDs 17 and 19 detect the S and the P polarized lights. Electric signals proportional to the respective intensities of the polarized lights are input to the differential amplifier 21. An electric signal output from the differential amplifier 21 is proportional to the amplitude of the electric field within the EO crystal 7. Therefore, by measuring the electric signal output from the differential amplifier 21, the amplitude of the electric field within the EO crystal 7 can be detected. The amplitude of the electric field within the EO crystal 7 is proportional to the potential at the measured point of the human body 100 or the DUT 201. Therefore, by detecting the electric signal output from the differential amplifier 21, the potential at the measured point can be detected.

However, according to the conventional electric field sensor, as shown in FIG. 5 and FIG. 6, only a small part of the lines of electric force generated from the signal electrode 11 passes through the EO crystal 7. Therefore, the amplitude of the electric field within the EO crystal 7 is small. Consequently, the polarization state of the optical beam from the light source 1 cannot be modulated sufficiently. As a result, high sensitivity as the electric field sensor cannot be obtained.

DISCLOSURE OF THE INVENTION

The present invention has been achieved in the light of the above problems. It is an object of the present invention to provide an electric field sensor that can compensate for a reduction in the sensitivity of an electro optic crystal due to a natural birefringent index, and a method of adjusting the electric field sensor.

It is another object of the present invention to provide an electric field sensor that can prevent a reflection return light from entering a laser light source.

It is still another object of the present invention to provide an electric field sensor that can obtain high sensitivity by increasing the amplitude of an electric field within an electro optic crystal.

In order to achieve the above objects, according to a first aspect of the invention, there is provided an electric field sensor including: a light source; an electro optic crystal which is applied with an electric field based on a signal under test, in which a birefringent index changes according to the electric field, and which changes a polarization state of light incident from the light source according to the birefringent index and emits the light; a detector that detects an electric signal according to the change of the polarization state of the light emitted from the electro optic crystal; a first electrode that is provided close to the electro optic crystal, and that applies the electric field based on the signal under test to the electro optic crystal; a second electrode that is provided close to the electro optic crystal, thereby forming a pair with the first electrode; and an auxiliary electrode that is electrically connected to the second electrode and that forms a capacitance with ground.

According to a second aspect of the invention, there is provided the electric field sensor according to the first aspect of the invention, wherein a surface area of the auxiliary electrode is larger than each surface are of the first electrode and the second electrode.

According to a third aspect of the invention, there is provided the electric field sensor according to the second aspect of the invention, wherein a shape of the auxiliary electrode is any one of a bar shape, a tabular shape, and a spherical shape.

According to a fourth aspect of the invention, there is provided the electric field sensor according to the first aspect of the invention, wherein a distance between the auxiliary electrode and the second electrode is larger than a distance between the first electrode and the second electrode.

According to a fifth aspect of the invention, there is provided the electric field sensor according to the first aspect of the invention, the electric field sensor further including distance changing means for changing a distance between the auxiliary electrode and the second electrode by moving the auxiliary electrode.

According to a sixth aspect of the invention, there is provided the electric field sensor according to the fifth aspect of the invention, the electric field sensor further including control means for controlling the detector to operate when the distance changing means separates the auxiliary electrode from the second electrode by a predetermined distance or more.

According to a seventh aspect of the invention, there is provided the electric field sensor according to the first aspect of the invention, wherein the auxiliary electrode is insulated from a circuit that constitutes the detector and a circuit that drives the light source.

In order to achieve the above objects, according to an eighth aspect of the invention, there is provided an electric field sensor including: a quarter wave plate that converts a P polarized light and an S polarized light into a circularly polarized light, respectively; an electro optic crystal which is applied with an electric field based on a signal under test, in which a birefringent index changes according to the electric field, and which changes a polarization state of the circularly polarized light from the quarter wave plate according to the birefringent index and emits the light; a detector that detects an electric signal according to the change of the polarization state of the light emitted from the electro optic crystal; and reflection light separating means that is positioned at a pre-stage of the quarter wave plate, that guides an incident P polarized light or S polarized light to the quarter wave plate, and guides an S polarized light or a P polarized light obtained by conversion from a circularly polarized light returned from the electro optic crystal by the quarter wave plate, to a direction different from an incident direction of the incident P polarized light or S polarized light.

According to a ninth aspect of the invention, there is provided the electric field sensor according to the eighth aspect of the invention, wherein the reflection light separating means is any one of a polarization plate, a polarizing beam splitter, a Glan-Thompson prism, and a Wollaston prism.

According to a tenth aspect of the invention, there is provided the electric field sensor according to the ninth aspect of the invention, wherein the reflection light separating means is a polarizing beam splitter that transmits a P polarized light and reflects an S polarized light.

According to an eleventh aspect of the invention, there is provided the electric field sensor according to the eighth aspect of the invention, further including a light source that is positioned at a pre-stage of the reflection light separating means and that emits either one of a P polarized light and an S polarized light.

In order to achieve the above objects, according to a twelfth aspect of the invention, there is provided an electric field sensor including: an electro optic crystal which is applied with an electric field based on a signal under test, in which a birefringent index changes according to the electric field, and which changes a polarization state of incident light according to the birefringent index and emits the light; a polarizing beam splitter that transmits one of a P polarized light component and an S polarized light component of the light having the changed polarization state which is emitted from the electro optic crystal, and that reflects the other of the polarized light components, thereby splitting the light having the changed polarization state into the P polarized light component and the S polarized light component; a first quarter wave plate that converts the P polarized light component into a circularly polarized light; a second quarter wave plate that converts the S polarized light component into a circularly polarized light; a first photo detector that converts the P polarized light component, which is converted into the circularly polarized light by the first quarter wave plate, into an electric signal; and a second photo detector that converts the S polarized light component, which is converted into the circularly polarized light by the second quarter wave plate, into an electric signal.

In order to achieve the above objects, according to a thirteenth aspect of the invention, there is provided an electric field sensor including: a light source; an electro optic crystal which is applied with an electric field based on a signal under test, in which a birefringent index changes according to the electric field, and which changes a polarization state of light incident from the light source according to the birefringent index and emits the light; a pair of electrodes for applying the electric field based on the signal under test to the electro optic crystal; a detector that splits the light emitted from the electro optic crystal into a P polarized light component and an S polarized light component, and obtains an alternate current signal corresponding to a difference between intensities of the respective polarized light components; and compensating means for offsetting a change in a polarization sate of the light incident from the light source when the electric field is not applied, due to a natural birefringence held by the electro optic crystal.

According to a fourteenth aspect of the invention, there is provided the electric field sensor according to the thirteenth aspect of the invention, wherein the light incident to the electro optic crystal is an optional polarized light, and the compensating means includes: a quarter wave plate of which electric main axis coincides with a main axis of an elliptically polarized light emitted from the electro optic crystal, and which converts the elliptically polarized light into a linearly polarized light; and a half wave plate that adjusts an angle of a polarization surface of the linearly polarized light emitted from the quarter wave plate based on a fact that an angle formed between an electric main axis of the half wave plate and the electric main axis of the electro optic crystal is $n\cdot\pi/4-\phi_o/2$ (where n is an integer) when an angle formed between the polarization surface of the linearly polarized light from the quarter wave plate and the electric main axis of the electro optic crystal is $\pi/4-\phi_o$ without the electric field applied.

According to a fifteenth aspect of the invention, there is provided the electric field sensor according to the thirteenth aspect of the invention, wherein the light incident to the electro optic crystal is a linearly polarized light of which a polarization surface forms an angle $\pi/4$ with an electric main axis of the electro optic crystal, and the compensating means includes: a quarter wave plate of which an electric main axis forms an angle $\pi/4$ with the electric main axis of the electro optic crystal, and which converts an elliptically polarized light emitted from the electro optic crystal into a linearly polarized light; and a half wave plate that adjusts an angle of a polarization surface of the linearly polarized light emitted from the quarter wave plate based on a fact that an angle formed between an electric main axis of the half wave plate and the electric main axis of the electro optic crystal is $n\cdot\pi/4-\phi_o/2$ (where n is an integer) when a phase difference included in the elliptically polarized light emitted from the electro optic crystal is $\phi_o$ without the electric field applied.

According to a sixteenth aspect of the invention, there is provided the electric field sensor according to the thirteenth aspect of the invention, wherein the light incident to the electro optic crystal is a circularly polarized light, and the compensating means includes: a quarter wave plate of which an electric main axis forms an angle $\pi/4$ with an electric main axis of the electro optic crystal, and which converts an elliptically polarized light emitted from the electro optic crystal into a linearly polarized light; and a half wave plate that adjusts an angle of a polarization surface of the linearly polarized light emitted from the quarter wave plate based on a fact that an angle formed between an electric main axis of the half wave plate and the electric main axis of the electro optic crystal is $n \cdot \pi/4 - \phi_o/2$ (where n is an integer) when a phase difference included in the elliptically polarized light emitted from the electro optic crystal is $\phi_o$ without the electric field applied.

According to a seventeenth aspect of the invention, there is provided the electric field sensor according to any one of the fourteenth to the sixteenth aspects of the invention, wherein $\phi_o$ is determined based on $\phi_o = (2\pi/\lambda)(n_o - n_e) L$, where $n_o$ is a refractive index of the electro optic crystal for ordinary light, $n_e$ is a refractive index of the electro optic crystal for extraordinary light, $\lambda$ is a wavelength (meter) of light in vacuum, and L is a length (meter) of the electro optic crystal in the direction of light.

According to an eighteenth aspect of the invention, there is provided the electric field sensor according to the thirteenth aspect of the invention, wherein the compensating means includes: a pair of control electrodes for applying the electric field based on a control signal to the electro optic crystal; and control signal generating means for generating the control signal that offsets a change in the polarization state of the light incident from the light source when the electric field based on the signal under test is not applied, based on the alternate current signal obtained by the detector.

According to a nineteenth aspect of the invention, there is provided the electric field sensor according to the thirteenth aspect of the invention, wherein the compensating means includes: an adder that adds a control signal to the signal under test; and control signal generating means for generating the control signal that offsets a change in the polarization state of the light incident from the light source when the electric field based on the signal under test is not applied, based on the alternate current signal obtained by the detector.

According to a twentieth aspect of the invention, there is provided the electric field sensor according to the eighteenth or the nineteenth aspect of the invention, wherein the control signal generating means includes: a first buffer amplifier and a second buffer amplifier that input an electric signal based on the P polarized light component and an electric signal based on the S polarized light component, respectively; a first low-pass filter and a second low-pass filter that input outputs from the first buffer amplifier and the second buffer amplifier, respectively; and an integrator that inputs outputs from the first low-pass filter and the second low-pass filter, respectively, and that integrates a difference between the outputs.

In order to achieve the above objects, according to a twenty-first aspect of the invention, there is provided a method of adjusting an electric field sensor including: a light source; an electro optic crystal which is applied with an electric field based on a signal under test, in which a birefringent index changes according to the electric field, and which changes a polarization state of incident optional polarized light according to the birefringent index and emits the light; a pair of electrodes for applying the electric field based on the signal under test to the electro optic crystal; and a detector that splits the light emitted from the electro optic crystal into a P polarized light component and an S polarized light component, and obtains an alternate current signal corresponding to a difference between intensities of the respective polarized light components, the method including: providing a quarter wave plate that converts an elliptically polarized light emitted from the electro optic crystal into a linearly polarized light such that an electric main axis of the quarter wave plate coincides with an electric main axis of the elliptically polarized light; and providing a half wave plate that adjusts an angle of a polarization surface of the linearly polarized light emitted from the quarter wave plate such that an angle formed between an electric main axis of the half wave plate and the electric main axis of the electro optic crystal becomes $n \cdot \pi/4 - \phi_o/2$ (where n is an integer) when an angle formed between the polarization surface of the linearly polarized light from the quarter wave plate and the electric main axis of the electro optic crystal is $\pi/4 - \phi_o$ without the electric field applied.

In order to achieve the above objects, according to a twenty-second aspect of the invention, there is provided a method of adjusting an electric field sensor including: a light source; an electro optic crystal which is applied with an electric field based on a signal under test, in which a birefringent index changes according to the electric field, and which changes a polarization state of a linearly polarized light whose polarization surface forms an angle $\pi/4$ with an electric main axis of the electro optic crystal according to the birefringent index and emits the light; a pair of electrodes for applying the electric field based on the signal under test to the electro optic crystal; and a detector that splits the light emitted from the electro optic crystal into a P polarized light component and an S polarized light component, and obtains an alternate current signal corresponding to a difference between intensities of the respective polarized light components, the method including: providing a quarter wave plate that converts an elliptically polarized light emitted from the electro optic crystal into a linearly polarized light such that an electric main axis of the quarter wave plate forms an angle $\pi/4$ with an electric main axis of the electro optic crystal; and providing a half wave plate that adjusts an angle of a polarization surface of the linearly polarized light emitted from the quarter wave plate such that an angle formed between an electric main axis of the half wave plate and the electric main axis of the electro optic crystal becomes $n \cdot \pi/4 - \phi_o/2$ (where n is an integer) when a phase difference included in the elliptically polarized light emitted from the electro optic crystal is $\phi_o$ without the electric field applied.

In order to achieve the above objects, according to a twenty-third aspect of the invention, there is provided a method of adjusting an electric field sensor including: a light source; an electro optic crystal which is applied with an electric field based on a signal under test, in which a birefringent index changes according to the electric field, and which changes a polarization state of incident circularly polarized light according to the birefringent index and emits the light; a pair of electrodes for applying the electric field based on the signal under test to the electro optic crystal; and a detector that splits the light emitted from the electro optic crystal into a P polarized light component and an S polarized light component, and obtains an alternate current signal corresponding to a difference between intensities of the respective polarized light components, the method including: providing a quarter wave plate that converts an elliptically polarized light emitted from the electro optic crystal into a linearly polarized light such that an electric main axis of the quarter wave plate forms an angle $\pi/4$ with an electric main axis of the electro optic crystal; and providing a half wave plate that adjusts an angle of a polarization surface of the linearly polarized light emitted from the quarter wave plate such that an angle formed between an electric main axis of the half wave plate and the electric main axis of the electro optic crystal becomes $n \cdot \pi/4 - \phi_o/2$ (where n is an integer) when a phase difference included in the elliptically polarized light emitted from the electro optic crystal is $\phi_o$ without the electric field applied.

According to a twenty-fourth aspect of the invention, there is provided the method of adjusting an electric field sensor according to any one of the twenty-first to the twenty-third aspects of the invention, wherein $\phi_o$ is determined based on $\phi_o=(2\pi/\lambda)(n_o-n_e)L$, where $n_o$ is a refractive index of the electro optic crystal for ordinary light, $n_e$ is a refractive index of the electro optic crystal for extraordinary light, $\lambda$ is a wavelength (meter) of light in vacuum, and L is a length (meter) of the electro optic crystal in the direction of light.

According to a twenty-fifth aspect of the invention, there is provided the method of adjusting an electric field sensor according to any one of the twenty-first to the twenty-third aspects of the invention, wherein $\phi_o$ is determined by measurement.

In order to achieve the above objects, according to a twenty-sixth aspect of the invention, there is provided a method of adjusting an electric field sensor including: a light source; an electro optic crystal which is applied with an electric field based on a signal under test, in which a birefringent index changes according to the electric field, and which changes a polarization state of light incident from the light source according to the birefringent index and emits the light; a pair of electrodes for applying the electric field based on the signal under test to the electro optic crystal; a detector that splits the light emitted from the electro optic crystal into a P polarized light component and an S polarized light component, and obtains an alternate current signal corresponding to a difference between intensities of the respective polarized light components; a pair of control electrodes for applying the electric field based on a control signal to the electro optic crystal; and control signal generating means for generating the control signal, the method including: displaying the alternate current signal obtained by the detector; and adjusting the control signal generating means to generate the control signal that offsets a change in the polarization state of the light incident from the light source when the electric field based on the signal under test is not applied, based on the displayed alternate current signal.

In order to achieve the above objects, according to a twenty-seventh aspect of the invention, there is provided a method of adjusting an electric field sensor including: a light source; an electro optic crystal which is applied with an electric field based on a signal under test, in which a birefringent index changes according to the electric field, and which changes a polarization state of light incident from the light source according to the birefringent index and emits the light; a pair of electrodes for applying the electric field based on the signal under test to the electro optic crystal; a detector that splits the light emitted from the electro optic crystal into a P polarized light component and an S polarized light component, and obtains an alternate current signal corresponding to a difference between intensities of the respective polarized light components; an adder that adds a control signal to the signal under test; and control signal generating means for generating the control signal, the method including: displaying the alternate current signal obtained by the detector; and adjusting the control signal generating means to generate the control signal that offsets a change in the polarization state of the light incident from the light source when the electric field based on the signal under test is not applied, based on the displayed alternate current signal.

BRIEF DESCRIPTION OF THE DRAWINGS

FIGS. 2(a) to 2(f) are diagrams showing a relationship between a polarization state of an optical beam incident to a PBS and an electric signal corresponding to the polarization state.

BEST MODE FOR CARRYING OUT THE INVENTION

Exemplary embodiments according to the present invention are explained in detail below with reference to the drawings.

An electric field sensor that can compensate for a reduction in the sensitivity of an electro optic crystal due to a natural refractive index, and a method of adjusting the electric field sensor are explained in first to eighth embodiments of the present invention. A light proceeding direction is defined as a z axis, an upward vertical direction is defined as a y axis, and a horizontal direction is defined as an x axis.

First Embodiment

Figure 7:
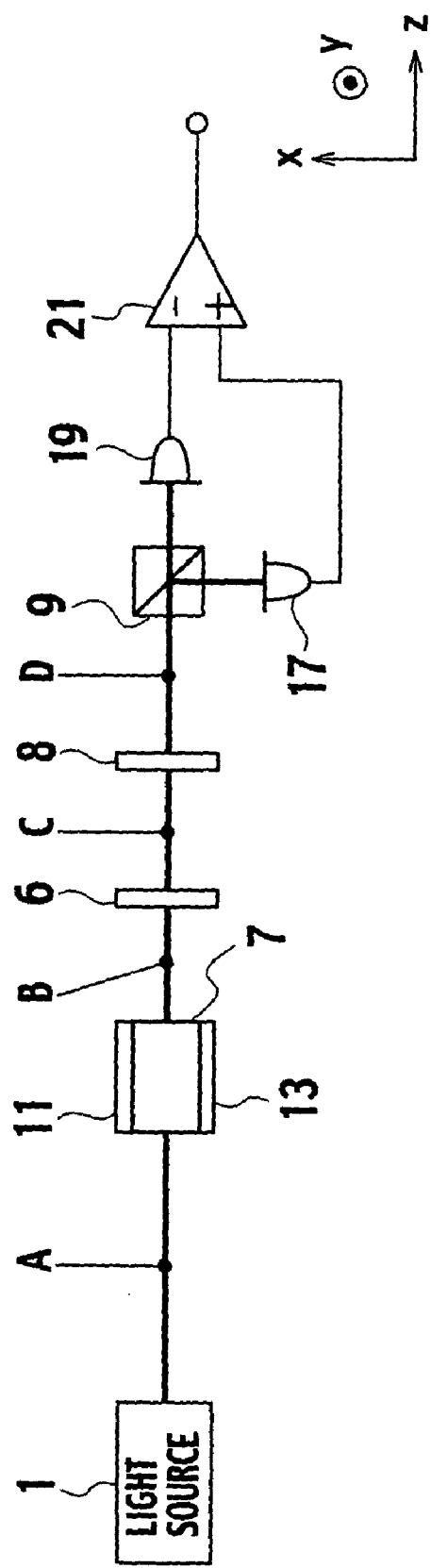
FIG. 7 is a diagram showing a configuration of an electric field sensor according to a first embodiment of the present invention.

FIG. 7 is a diagram showing a configuration of an electric field sensor according to a first embodiment of the present invention.

The electric field sensor according to the first embodiment includes: the electro optic crystal (hereinafter referred to as an "EO crystal") 7 of which birefringent index changes due to a coupling of electric fields; the pair of electrodes 11 and 13 that are provided to sandwich the EO crystal 7 to couple the electric field with the EO crystal 7; the light source 1 that inputs light to the EO crystal 7; a quarter wave plate (hereinafter referred to as a "QWP") 6 that converts an elliptically polarized light emitted from the EO crystal 7 into a linearly polarized light; a half wave plate (hereinafter referred to as an "HWP") 8 that adjusts a phase of the linearly polarized light; the polarizing beam splitter (hereinafter referred to as a "PBS") 9 that splits a linearly polarized light emitted from the HWP 8 into a P polarized light component and an S polarized light component; the two photo detectors (hereinafter referred to as "PDs") 17 and 19 that convert the polarized light components into electric signals; and the differential amplifier 21 that amplifies a difference between electric signals obtained by the photo detectors.

In the electric field sensor according to the first embodiment, a linearly polarized light emitted from the light source 1 is incident to the EO crystal 7. In this case, a polarization surface of the linearly polarized light at a point A is set to form an angle $\pi/4$ with an electric main axis of the EO crystal 7.

The EO crystal 7 has natural birefringence. When an electric field is not applied to the EO crystal 7, light at a point B is an elliptically polarized light. An electric main axis of the QWP 6 is set to form an angle $\pi/4$ with the electric main axis of the EO crystal 7. The elliptically polarized light at the point B is converted into a linearly polarized light when the elliptically polarized light passes through the QWP 6 having the above setting. Therefore, the light at a point C is the linearly polarized light. However, in general, an angle formed by the polarization surface of the linearly polarized light and the electric main axis of the EO crystal 7 is different from the corresponding angle at the point A. The HWP 8 disposed at a suitable angle converts the linearly polarized light at the point C into a linearly polarized light that includes a P polarized light component and an S polarized light component to the PBS 9 at a ratio of 1:1. The P polarized light is a linearly polarized light that passes through the PBS 9, and the S polarized light is a linearly polarized light that is reflected from the PBS 9. While the PBS 9 can be optionally disposed, it is usual that the PBS 9 is disposed to split the P polarized light from the S polarized light within a horizontal surface (x-z surface). Therefore, this usual layout is employed in the present embodiment, and the subsequent explanation is based on this assumption.

The polarization surface of the P polarized light coincides with the x-z horizontal surface, and the polarization surface of the S polarized light coincides with the y-z horizontal surface. Therefore, the polarization surface of the linearly polarized light at a point D forms an angle $\pi/4$ with the x-z horizontal surface.

Since the P component and the S component are included at a ratio of 1:1 in the linearly polarized light at the point D, the PD 19 and the PD 17 detect equivalent light amount. Since the PDs 19 and 17 output electric signals of a level proportional to the intensity of the received light, respectively, a level of the electric signal output from the differential amplifier 21 is zero. When an electric field is applied to the EO crystal 7, the angle formed between the polarization surface of the linearly polarized light and the x-z horizontal surface at the point D is deviated by $\delta$ from $\pi/4$. $\delta$ is proportional to an amplitude A of the electric field in the EO crystal 7. Therefore, when the electric field is applied, unbalance occurs between the light amount detected by the PD 17 and that detected by the PD 19, and the differential amplifier 21 outputs an electric signal of a level proportional to the electric field A. Consequently, the electric field applied to the EO crystal 7 can be detected, by detecting the electric signal output from the differential amplifier 21. The electric field in the EO crystal 7 is proportional to a potential difference between the electrodes attached to the EO crystal 7. Therefore, a detection of the electric signal output from the differential amplifier 21 is equivalent to a detection of a potential difference between the electrodes.

FIGS. 8(a) to 8(e) are diagrams showing a polarization state of the electric field sensor according to the first embodiment of the present invention. In these diagrams, light proceeds in a forward direction of the z axis (from the back to the front direction of the paper). A slow axis and a fast axis as one of electric main axes of the EO crystal 7 are coincided with the x axis (a horizontal direction) and the y axis (a vertical direction).

Figure 8:
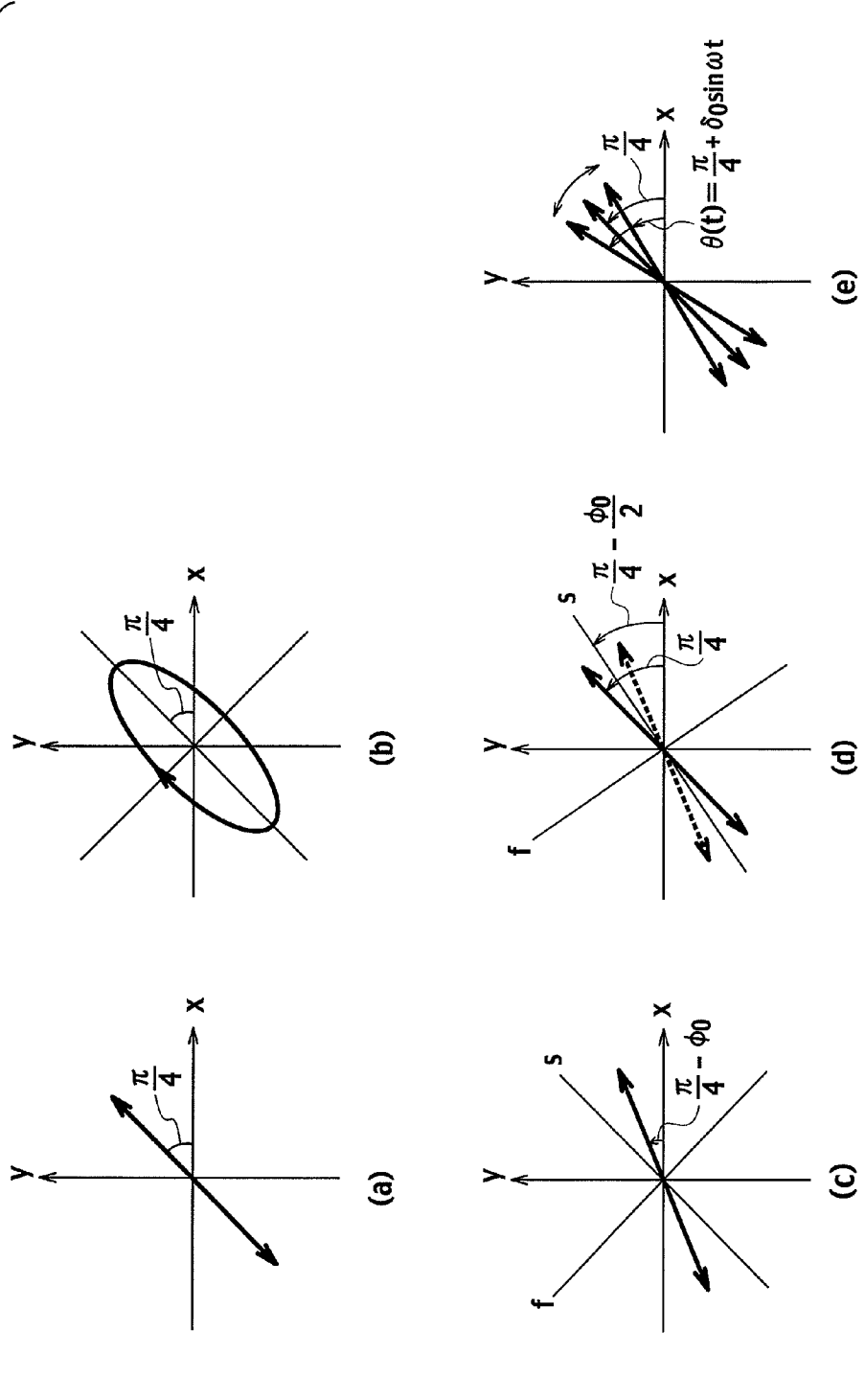
FIGS. 8(a) to 8(e) are diagrams showing a polarization state of the electric field sensor according to the first embodiment of the present invention.

FIG. 8(a) shows a polarization state of light at the point A. The polarization surface of a linearly polarized light forms an angle π/4 with the x axis (the slow axis of the EO) crystal 7).

FIG. 8(b) shows a polarization state of light at the point B. The light becomes an elliptically polarized light due to birefringence of the EO crystal 7. The main axis of this ellipse forms an angle π/4 with the x axis.

FIG. 8(c) shows a relationship between the polarization state of light at the point C and the electric main axis of the QWP 6. An s axis and an f axis express a slow axis and a fast axis of the QWP 6, respectively. The s axis forms an angle π/4 with the x axis. The elliptically polarized light at the point B is converted into a linearly polarized light. When a phase difference generated between independent polarized light components of light due to natural birefringence of the EO crystal 7 (a phase difference included in the elliptically polarized light emitted from the EO crystal 7) is denoted as $\phi_o$, an angle formed between the polarization surface of the linearly polarized light and the x axis is $\pi/4 - \phi_o$.

FIG. 8(d) shows a relationship between the polarization state of light at the point D and the electric main axis of the HWP 8. An s axis and an f axis express a slow axis and a fast axis of the HWP 8, respectively. A dotted line expresses the polarization state of the light at the point C. When an angle formed between the slow axis (s axis) of the HWP 8 with the x axis is set as follows, the angle formed between the polarization surface of the linearly polarized light and the x axis can be corrected to π/4. Obviously, the angle formed between the polarization surface of the linearly polarized light at the point D and the y axis (the fast axis of the EO crystal 7) can be also corrected to π/4:

$n \cdot \pi/4 - \phi_o/2$.

The value of $\phi_o$ (radian) can be determined from the following expression or by measurement:

$\phi_o = (2\pi/\lambda)(n_o - n_e)L$ where, λ denotes a wavelength (meter) of light (in the vacuum) incident to the crystal, L denotes a length (meter) of the crystal in the z direction, and $n_o$ and $n_e$ denote refractive indices of the EO crystal 7 for normal light and extraordinary light, respectively.

By such correction, the intensities of the S and the P polarized light components at the point D become equal, therefore a level of the electric signal output from the differential amplifier 21 becomes zero.

FIG. 8(e) shows a change in the polarization state of light at the point D when an electric field under test A(t) is applied to the EO crystal 7. The application of an alternate current electric field having a change $A(t) = A_o \sin \omega t$ is explained as an example. In this case, a phase difference φ(t) generated between independent polarized light components of light within the EO crystal 7 is expressed as $\phi(t) = \phi_o + \delta \sin \omega t$. Therefore, at the point D, an angle θ(t) formed between the polarization surface of the linearly polarized light and the x axis oscillates between $\pm \delta_o$ in an angular frequency ω. This relationship is expressed as $\theta(t) = \pi/4 + \delta_o \sin \omega t$.

Second Embodiment

Figure 9:
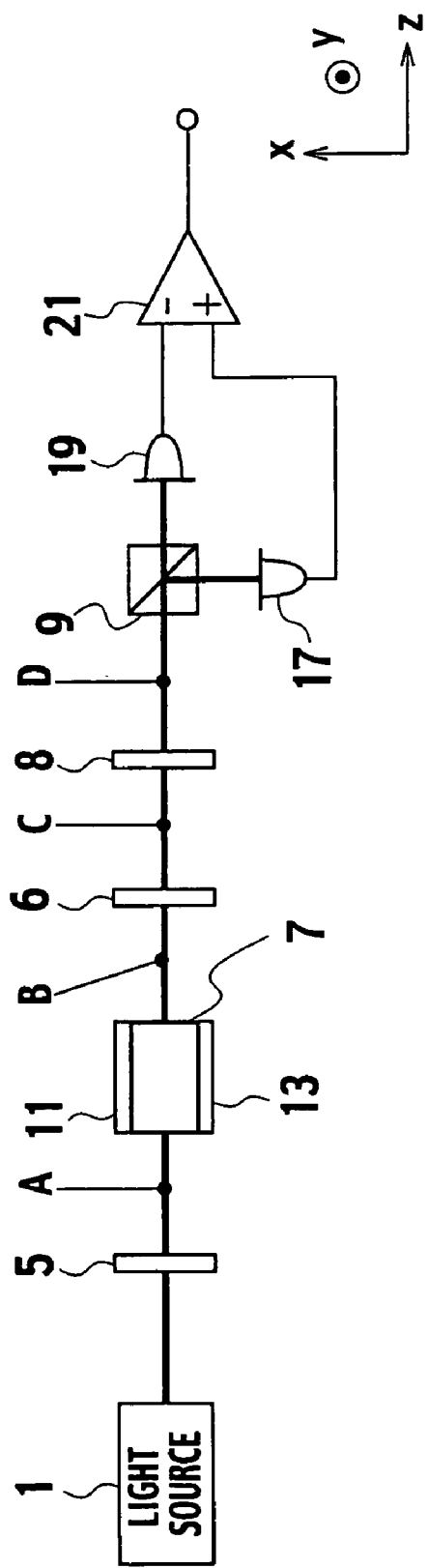
FIG. 9 is a diagram showing a configuration of an electric field sensor according to a second embodiment of the present invention.
Figure 10:
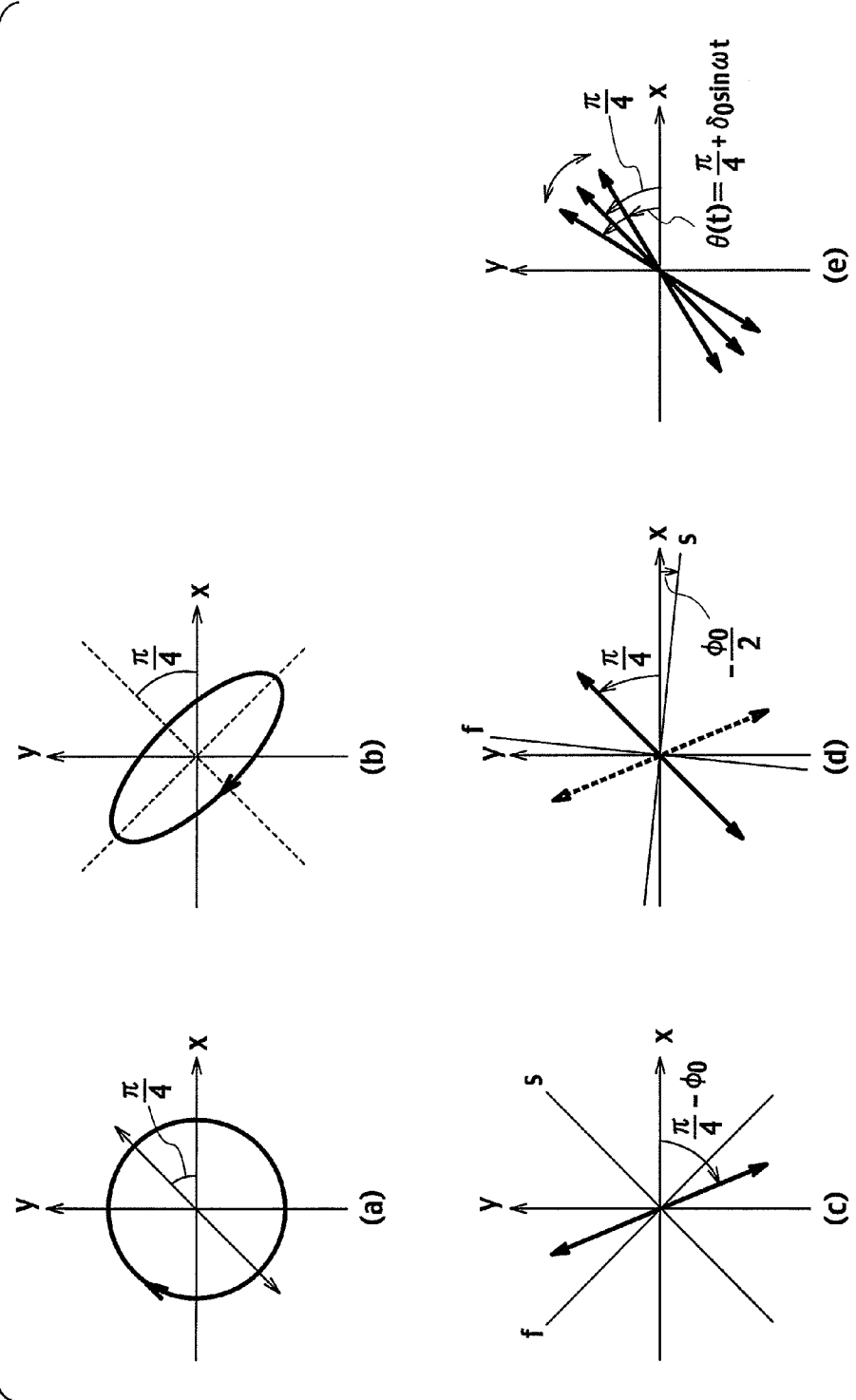
FIGS. 10(a) to 10(e) are diagrams showing a polarization state of the electric field sensor according to the second embodiment of the present invention.

FIG. 9 is a diagram showing a configuration of an electric field sensor according to a second embodiment of the present invention.

The electric field sensor according to the second embodiment is different from that according to the first embodiment in that the QWP 5 is inserted into between the light source 1 and the EO crystal 7.

The QWP 5 converts a linearly polarized light emitted from the light source 1 into a circularly polarized light. Therefore, the circularly polarized light is incident to the EO crystal 7. When the linearly polarized light is incident to the EO crystal 7 like in the first embodiment, in order to efficiently perform a modulation in a polarizing manner within the EO crystal 7, the polarization surface of the linearly polarized light needs to be set to form the angle π/4 with the electric main axis of the EO crystal 7. On the other hand, when a circularly polarized light is used, it is not necessary to set an angle between the polarization surface and the electric main axis. Therefore, the process of manufacturing the electric field sensor according to the present invention can be simplified.

FIGS. 10(a) to 10(e) are diagrams showing a polarization state of the electric field sensor according to the second embodiment of the present invention. FIGS. 10(a) to 10(e) correspond to FIGS. 8(a) to 8(e) in this order.

FIGS. 10(a) to 10(e) show a state that a clockwise circularly polarized light is incident to the crystal. The polarization state of the electric field sensor according to the second embodiment is expressed by replacing $\phi_o$ shown in FIGS. 8(a) to 8(e) with $\phi_o + \pi/2$.

In other words, when an angle formed between the slow axis (s axis) of the HWP 8 and the x axis is set as follows, the angle formed between the polarization surface of the linearly polarized light and the x axis can be corrected to π/4:

$\phi_o/2$.

Although not shown, when a counterclockwise circularly polarized light is incident to the crystal, the polarization state of the electric field sensor is expressed by replacing $\phi_o$ with $\phi_o - \pi/2$.

From the viewpoint of the adjustment of the angle of the HWP 8 explained above, even when the angle formed between the polarization surface of the linearly polarized light from the QWP 6 and the y axis (the fast axis of the EO crystal 7) is $\pi/4 - \phi_o$, the angle formed between the polarization surface of the linearly polarized light at the point D and the electric main axis of the EO crystal 7 can be corrected to π/4. Further, even when the angle formed between the s axis (or the f axis) of the HWP 8 and the x axis (or the y axis) is $n \cdot \pi/4 - \phi_o/2$ (where n is an integer), the angle formed between the polarization surface of the linearly polarized light at the point D and the electric main axis of the EO crystal 7 can be corrected to π/4.

FIGS. 11(a) to 11(f) are waveform diagrams of the electric field sensor according to the first and the second embodiments.

Figure 11:
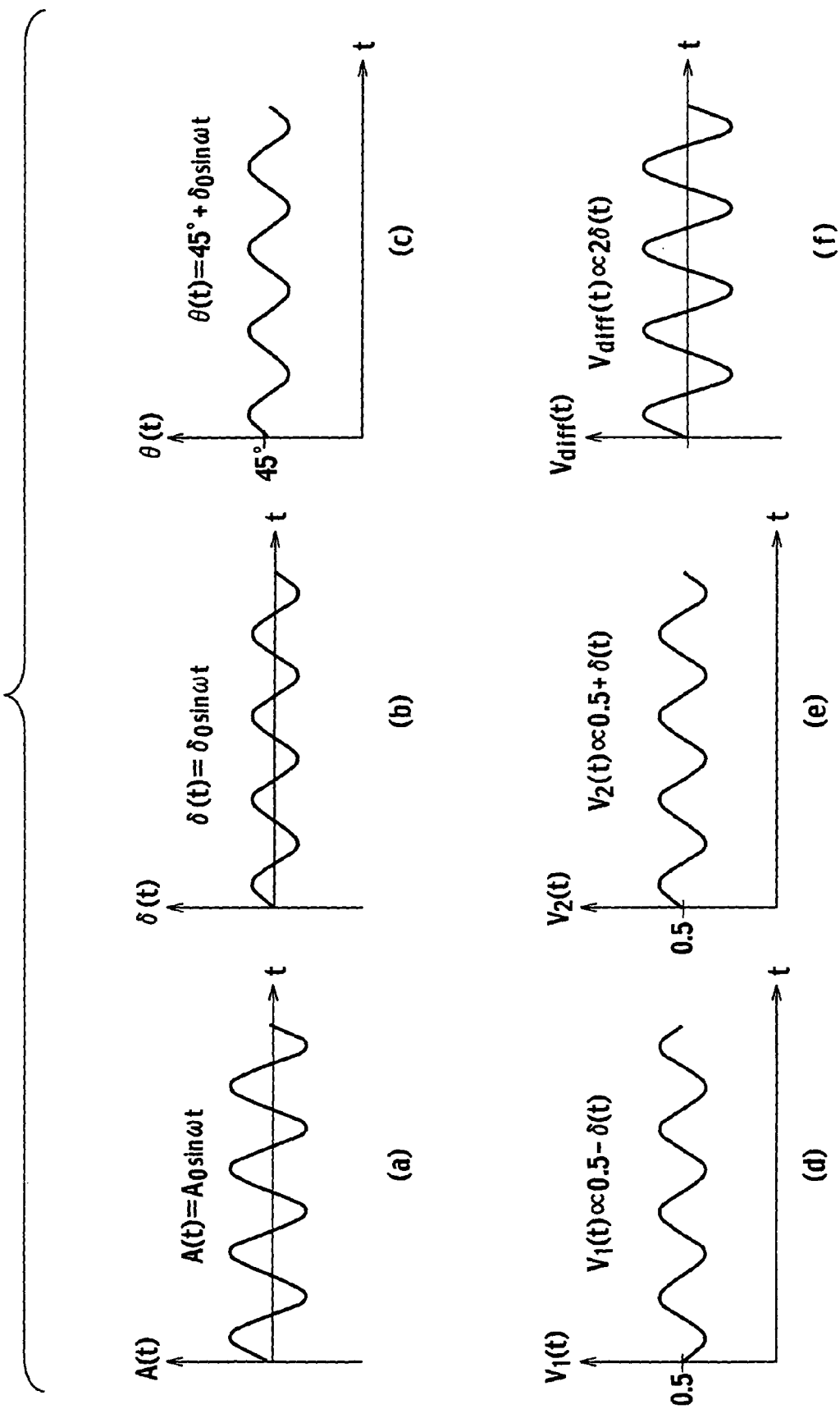
FIGS. 11(a) to 11(f) are waveform diagrams of the electric field sensor according to the first or the second embodiment when an EO crystal of the electric field sensor has a natural birefringent index.

FIG. 11(a) shows a waveform $A(t) = A_o \sin \omega t$ of an electric field under test, and FIG. 11(b) shows a phase difference $\delta(t) = \delta_o \sin \omega t$ that is generated between independent polarized light components of light attributable to an electric field under test and a change in the birefringent index due to the electric field. The waveform of A(t) is naturally the same as that of δ(t). FIG. 11(c) shows an angle $\theta(t) = \pi/4 + \delta_o \sin \omega t$ that is formed between the polarization surface of the linearly polarized light at the point D in FIG. 7 or FIG. 9 and the x axis. This polarization surface oscillates in a sinusoidal waveform around $\theta(t)=\pi/4$. FIG. 11(d) and FIG. 11(e) show waveforms (V1(t) and V2(t)) of electric signals that are output from the PD 19 and the PD 17, respectively. Considering the fact that the levels of the electric signals output from the PD 19 and the PD 17 are proportional to the intensities of the light incident to the respective PDs and that a P polarized light and an S polarized light are incident to the PD 19 and the PD 17, respectively, the following relationships are established. However, in the last modification of the expression, a condition $\delta_o \ll \pi/2$ is used. A phase change attributable to the electric field under test is generally small. Therefore, this condition is sufficiently practicable.

$V_1(t) \propto \cos^2 \theta(t) = 0.5 \{1 - \sin 2(\delta_o \sin \omega t)\} \approx 0.5 - \delta_o \sin \omega t$
$V_2(t) \propto \cos^2 \theta(t) = 0.5 \{1 + \sin 2(\delta_o \sin \omega t)\} \approx 0.5 + \delta_o \sin \omega t$ Therefore, V1(t) and V2(t) have the same direct current components as shown in FIG. 11(d) and FIG. 11(e), and change in mutually reverse phases. FIG. 11(f) shows a waveform of an electric signal $V_{diff}(t) = V_2(t) - V_1(t) \propto 2\delta_o \sin \omega t$ output from the differential amplifier 21. By carrying out a differential calculation, the direct current component can be removed, and the amplitude can be doubled. The waveform of $V_{diff}(t)$ is the same as the waveform of the electric field under test A(t). Therefore, by detecting $V_{diff}(t)$, information concerning A(t) can be extracted.

Third Embodiment

Figure 12:
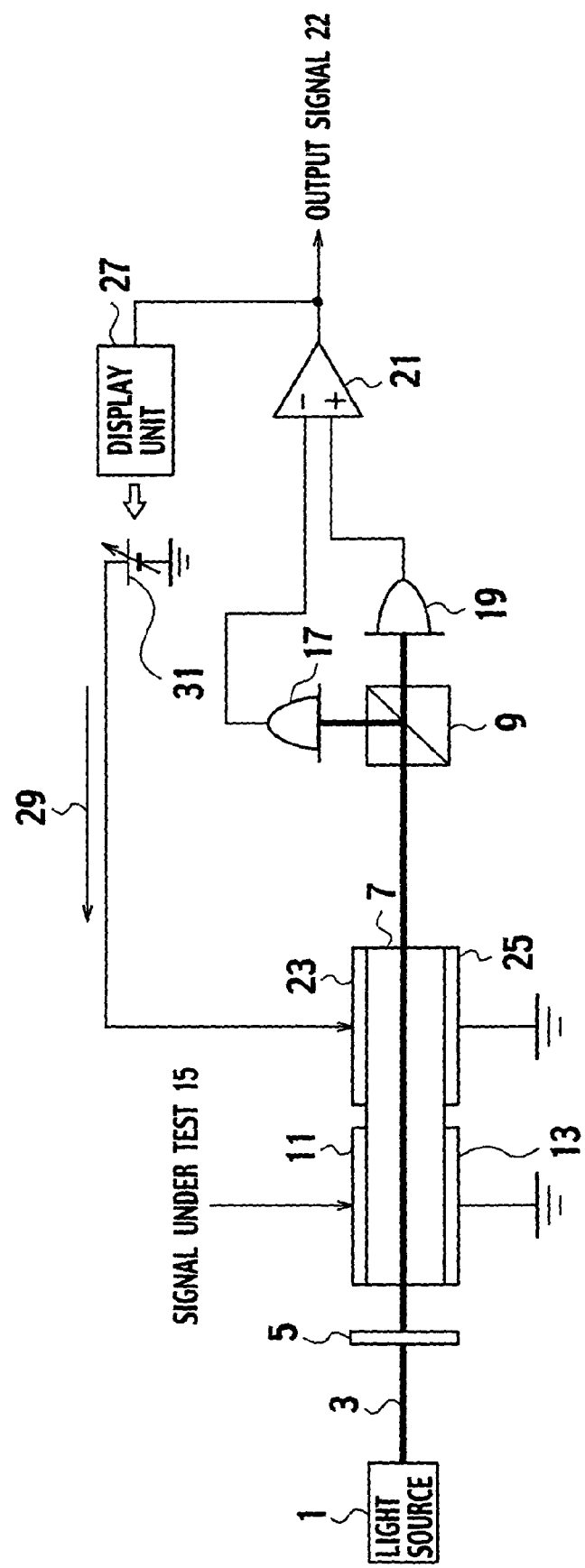
FIG. 12 is a diagram showing a configuration of an electric field sensor according to a third embodiment of the present invention.

FIG. 12 is a diagram showing a configuration of an electric field sensor according to a third embodiment.

Like in the first and the second embodiments, the electric field sensor according to the third embodiment is configured such that an optical beam is input to an EO crystal to which an alternate current electric field is applied, a PBS splits light emitted from the EOcrystal into an S polarized light and a P polarized light, and a differential amplifier detects a difference between intensities of the polarized lights.

Specifically, in FIG. 12, the optical beam 3 emitted from the light source 1 passes through the QWP 5 and the EO crystal 7, and is incident to the PBS 9. The QWP 5 adjusts the polarization state of the optical beam immediately before being incident to the PBS 9 such that the optical beam becomes a circularly polarized light at a predetermined ambient temperature. An electric field corresponding to the signal under test 15 (for example, an alternate current of a few kHz to a few hundred MHz) is applied to the EO crystal 7 via the signal electrode 11 and the ground electrode 13. The optical beam 3 is modulated in a polarizing manner within the EO crystal 7 according to the electric field. The PBS 9 splits the modulated light into an S polarized light component and a P polarized light component. In this case, each polarized light component is converted into an intensity-modulated light. The intensity-modulated S and P polarized light components change in mutually reverse phases. The PD 17 and the PD 19 receive the S and the P polarized light components respectively, and the differential amplifier 21 differentiates the outputs from both PDs, thereby obtaining the output signal 22.

A method of adjusting polarization is explained next when the electric field sensor having the above configuration is positioned in an environment at an ambient temperature different from the predetermined ambient temperature or when the QWP 5 on its own cannot adjust the polarization and requires a further adjustment. Specifically, this adjusting method is implemented to experiment the electric field sensor or to match characteristics of a product using the electric field sensor at a shipment stage.

The EO crystal 7 of the electric field sensor according to the third embodiment is provided with a control electrode 23 to which a signal for adjustment is given, and a control ground electrode 25.

FIGS. 13(a) to 13(e) are layout diagrams of electrodes according to the third embodiment.

Figure 13:
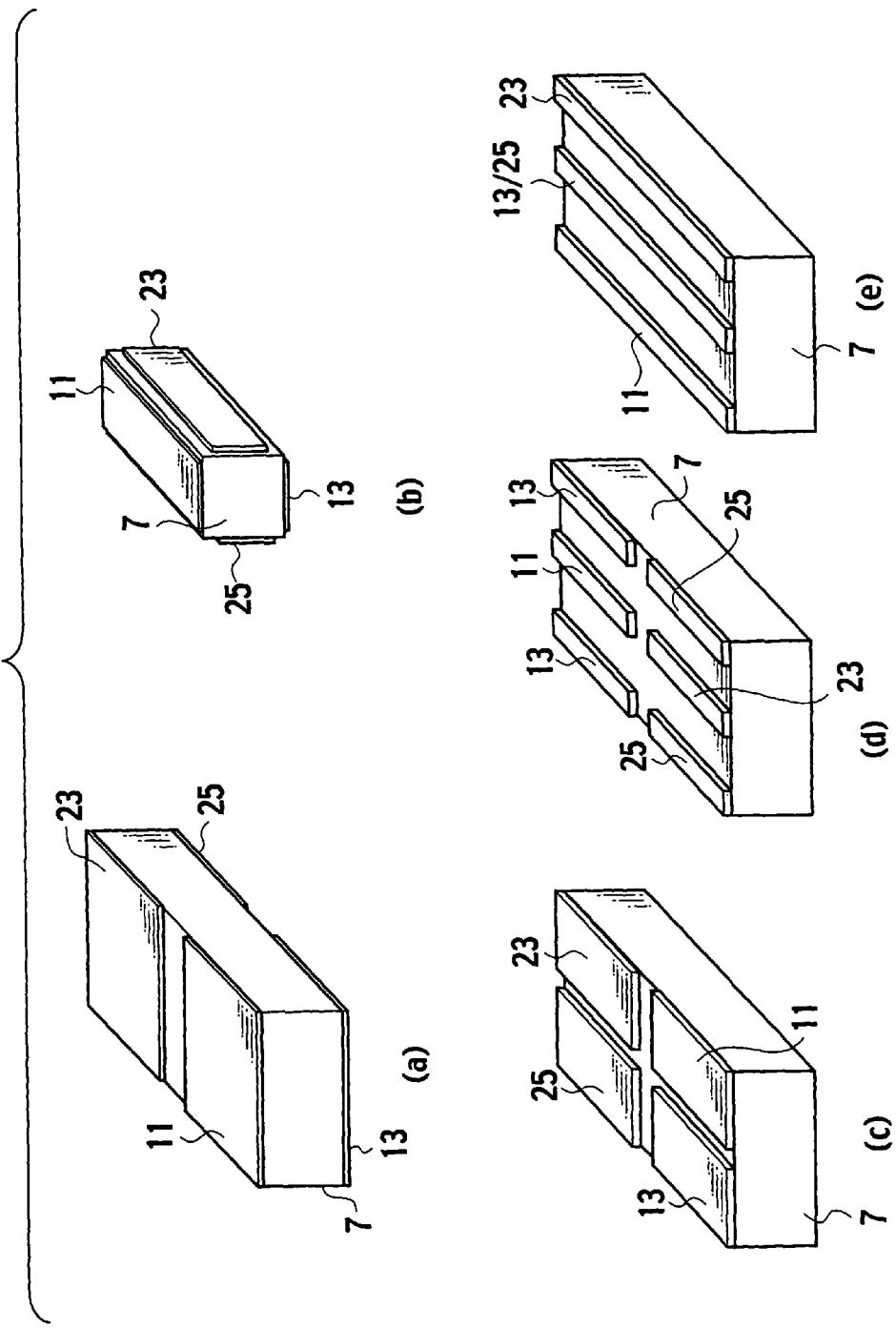
FIGS. 13(a) to 13(e) are layout diagrams of electrodes according to the third embodiment.

As shown in FIG. 13(a) and FIG. 13(b), when the signal electrode 11 and the ground electrode 13 are disposed to sandwich the EO crystal 7, and when the control electrode 23 and the control ground electrode 25 are disposed to sandwich the EO crystal 7, a uniform electric field is applied to the EO crystal 7, which is preferable. As shown in FIG. 13(c), when electrodes are provided on one side of the EO crystal 7, the electrodes can be easily mounted when the EO crystal 7 is thin. As shown in FIG. 13(d), the ground electrodes can be separated. As shown in FIG. 13(e), when the ground electrode 13 and the control ground electrode 25 are common, the electric field sensor can have a simple configuration.

The explanation continues referring back to FIG. 12.

To adjust the electric field sensor, a display unit 27 and a variable direct current power source 31 are used. The display unit 27 displays the output signal 22 as shown in FIG. 2(f), for example. The variable direct current power source 31 gives a control signal (a direct current voltage) 31 to the control electrode 23.

For example, an operator adjusts (changes) a voltage (a voltage of a control signal 29) of the variable direct current power source 31 to eliminate the direct current component of the output signal 22 displayed in the display unit 27. When the control signal 29 is given to the control electrode 23, not only the electric field of the signal under test 15 but also the electric field of the control signal 29 is applied to the EO crystal 7. Based on the electric field of the control signal 29, the polarization state of the optical beam can be corrected to a circularly polarized light. Further, optical intensity noise can be sufficiently reduced.

Fourth Embodiment

Figure 14:
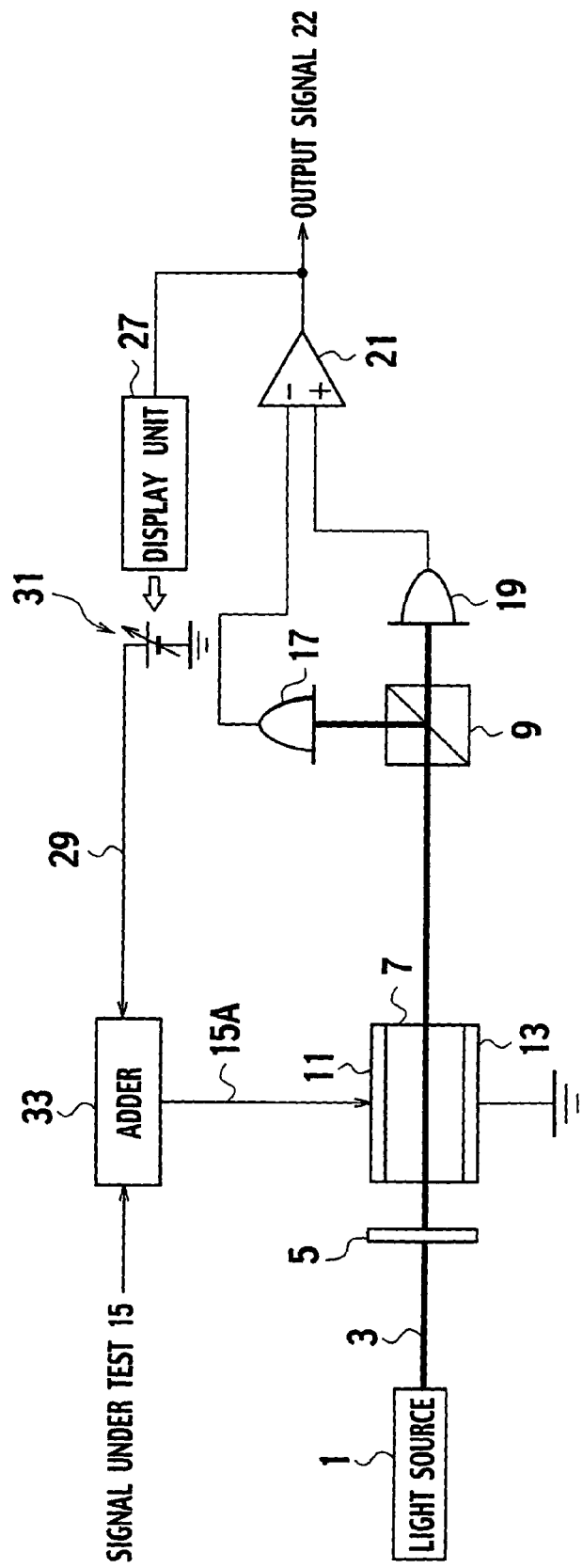
FIG. 14 is a diagram showing a configuration of an electric field sensor according to a fourth embodiment of the present invention.

FIG. 14 is a diagram showing a configuration of an electric field sensor according to a fourth embodiment.

A difference between an adjusting method according to the present embodiment and the adjusting method according to the third embodiment is mainly explained below. Explanation of identical items is omitted.

The electric field sensor according to the fourth embodiment does not have the control electrode 23 and the control ground electrode 25 in the EO crystal 7. Only the signal electrode 11 and the ground electrode 13 are provided as electrodes. The electric field sensor according to the fourth embodiment has an adder 33 in a signal path of the signal under test 15. A signal under test 15A after the addition is given to the signal electrode 11.

Figure 15:
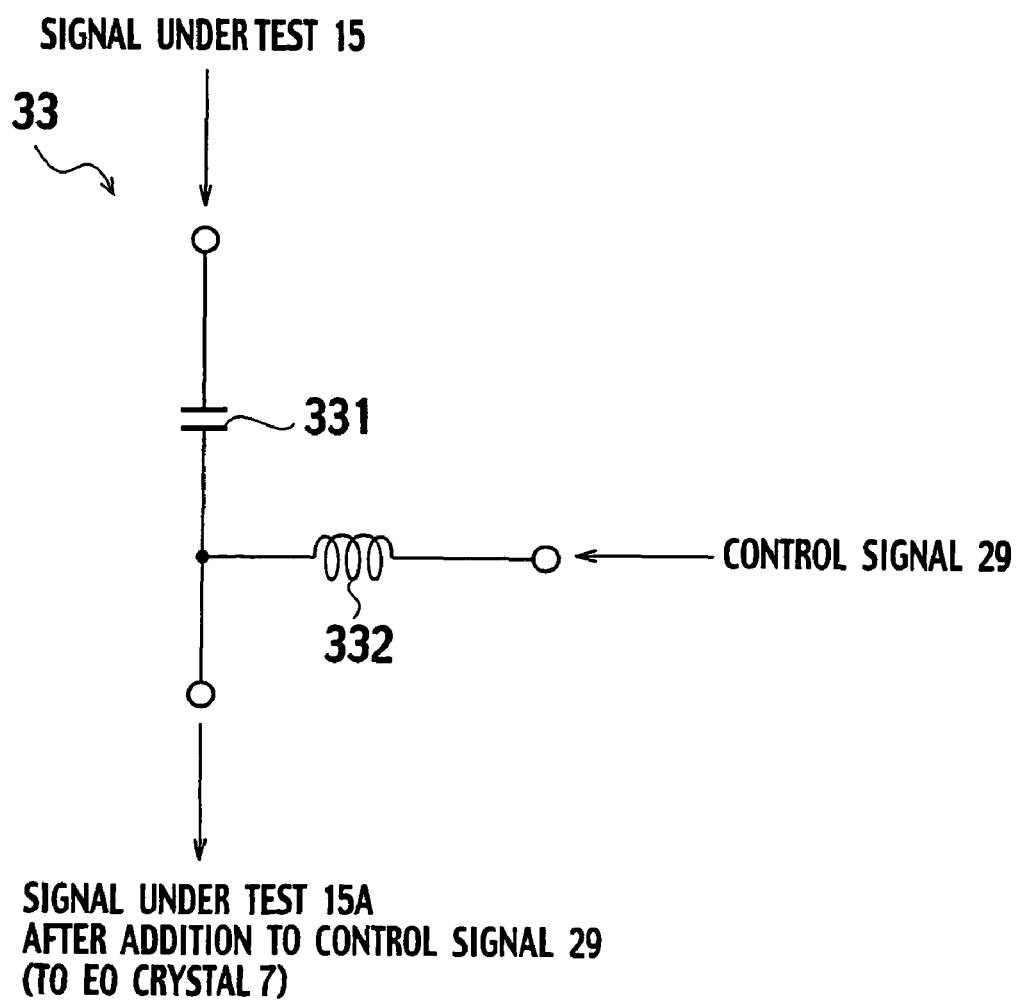
FIG. 15 is a circuit diagram of an adder.

FIG. 15 is a circuit diagram of the adder 33.

The adder 33 is configured by having a capacitor 331 and a coil 332 connected in series. The signal under test 15 is given to a terminal, not connected to the coil 332, of the capacitor 331. The control signal 29 is given to a terminal, not connected to the capacitor 331, of the coil 332. A signal at a connection point between the capacitor 331 and the coil 332 is given to the EO crystal 7 as the signal under test 15A. The capacitor 331 passes the signal under test 15 as a high-frequency signal, but interrupts the control signal 29 as a low-frequency signal. On the other hand, the coil 332 passes the low-frequency control signal 29, but interrupts the high-frequency signal under test 15. Therefore, the control signal 29 can be added to the signal under test 15. The adder 33 may be configured using a digital circuit.

The display unit 27 and the variable direct current power source 31 are also used to adjust this electric field sensor.

For example, an operator adjusts (changes) a voltage (a voltage of a control signal 29) of the variable direct current power source 31 to eliminate the direct current component of the output signal 22 displayed in the display unit 27. When the control signal 29 is given to the adder 33, not only the electric field of the signal under test 15 but also the electric field of the control signal 29 is applied to the EO crystal 7. Based on the electric field of the control signal 29, the polarization state of the optical beam can be corrected to a circularly polarized light. Further, optical intensity noise can be sufficiently reduced.

Fifth Embodiment

Figure 16:
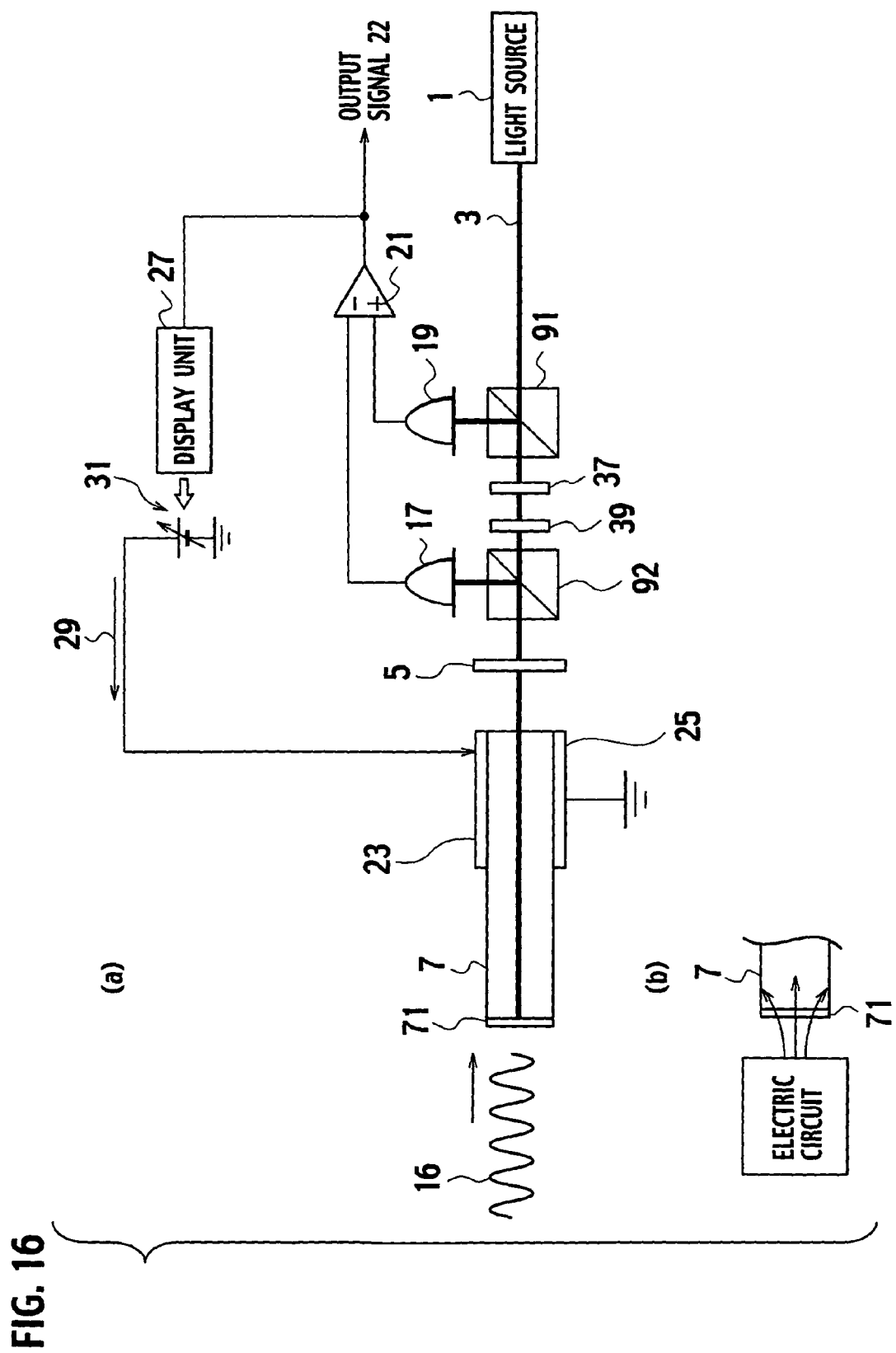
FIGS. 16(a) and 16(b) are diagrams showing a configuration of an electric field sensor according to a fifth embodiment of the present invention.

FIG. 16(a) is a diagram showing a configuration of an electric field sensor according to a fifth embodiment of the present invention.

The electric field sensor according to the fifth embodiment is used to measure an electric wave, and therefore has a reflection optical system. A difference between the electric field sensor according to the present embodiment and that according to the third embodiment is mainly explained below, and explanation of identical configurations is omitted.

The electric field sensor according to the fifth embodiment does not measure the signal under test 15 given to the electrodes provided in the EO crystal 7, but measures an electric wave that is directly incident to the EO crystal 7 after being propagated in space, or an electric field that is generated from an electric circuit under test as shown in FIG. 16(b). Therefore, the electric field sensor does not have the signal electrode 11 and the ground electrode 13.

The electric field sensor has PBSs 91 and 92 in this order on route from the light source 1 to the EO crystal 7, in place of the PBS 9. The QWP 5 is provided between the PBS 92 and the EO crystal 7. An HWP 37 and a Faraday rotator 39 are provided between the PBS 91 and the PBS 92. A dielectric mirror 71 is provided on the surface of the EO crystal 7 opposite to the incident surface of an optical beam. An electric wave under test 16 is incident to the surface of the dielectric mirror 71.

In the electric field sensor according to the fifth embodiment having the above configuration, the optical beam 3 from the light source 1 passes through the PBS 91, the HWP 37, the Faraday rotator 39, the PBS 92, and the QWP 5, and is incident to the EO crystal 7. The optical beam 3 is reflected from the dielectric mirror 71, is emitted from the EO crystal 7, passes through the QWP 5 again, and is incident to the PBS 92. The PBS 92 splits the optical beam 3 into an S polarized light component and a P polarized light component. The S polarized light component is incident to the PD 17. On the other hand, the Faraday rotator 39 and the HWP 37 convert the P polarized light component that passes through the PBS 92 into an S polarized light. The S polarized light is incident to the PBS 91. The PBS 91 inputs the S polarized light to the PD 19.

Figure 17:
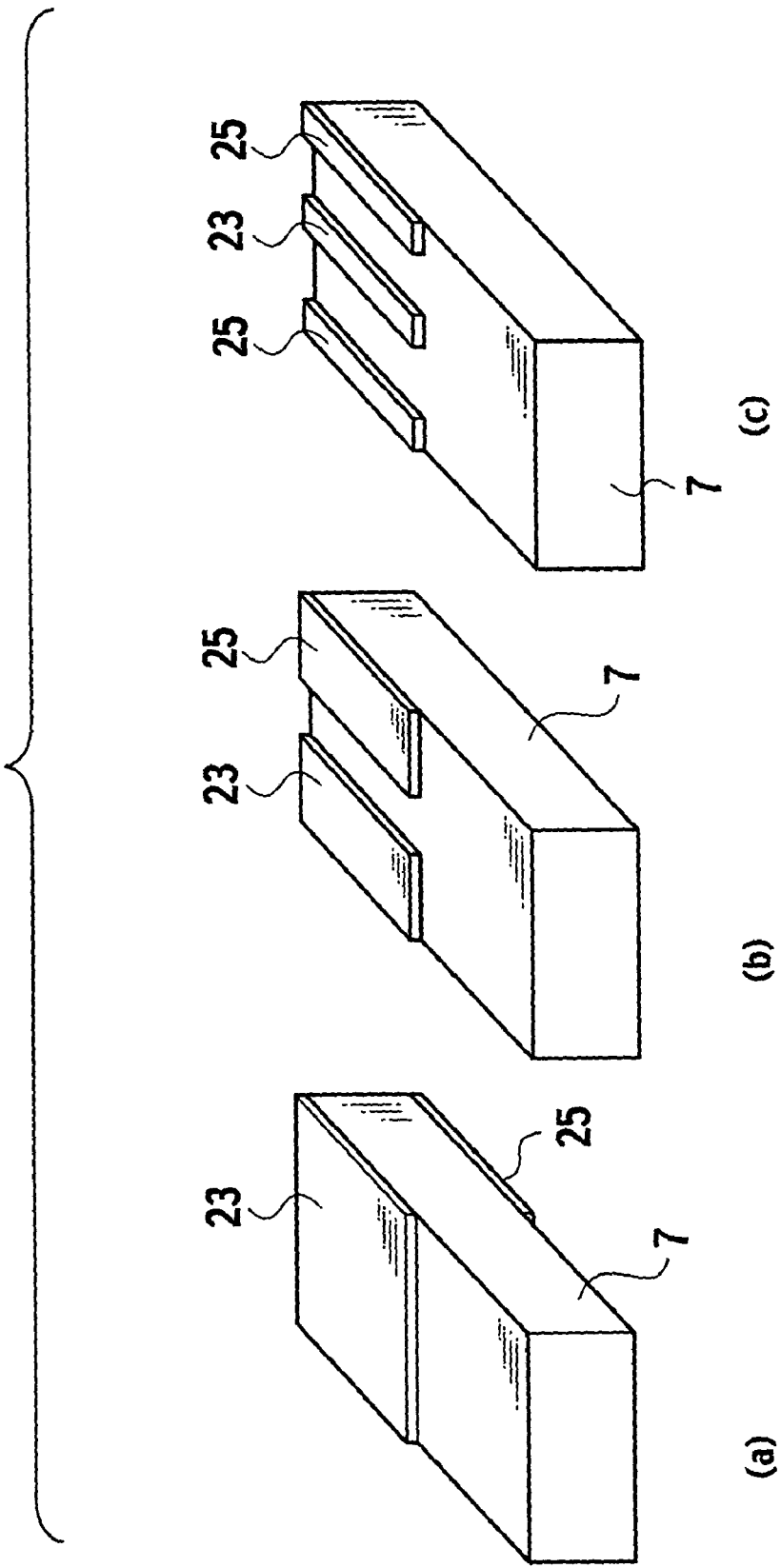
FIGS. 17(a) to 17(c) are layout diagrams of electrodes according to the fifth embodiment.

FIGS. 17(a) to 17(c) are layout diagrams of electrodes according to the fifth embodiment.

As shown in FIG. 17(a), the control electrode 23 and the control ground electrode 25 can be disposed to sandwich the EO crystal 7. As shown in FIG. 17(b), the electrodes can be provided on one side of the EO crystal 7. Alternatively, as shown in FIG. 17(c), the control ground electrode 25 can be separated. As explained above, according to the fifth embodiment, because an electrode to be applied with a signal under test is not necessary, the electric field sensor can have a simple configuration.

The display unit 27 and the variable direct current power source 31 are also used to adjust this electric field sensor.

For example, an operator adjusts (changes) a voltage (a voltage of a control signal 29) of the variable direct current power source 31 to eliminate the direct current component of the output signal 22 displayed in the display unit 27. When the control signal 29 is given to the adder 33, not only the electric field of the signal under test 15 but also the electric field of the control signal 29 is applied to the EO crystal 7. Based on the electric field of the control signal 29, the polarization state of the optical beam can be corrected to a circularly polarized light. Further, optical intensity noise can be sufficiently reduced.

Sixth Embodiment

Figure 18:
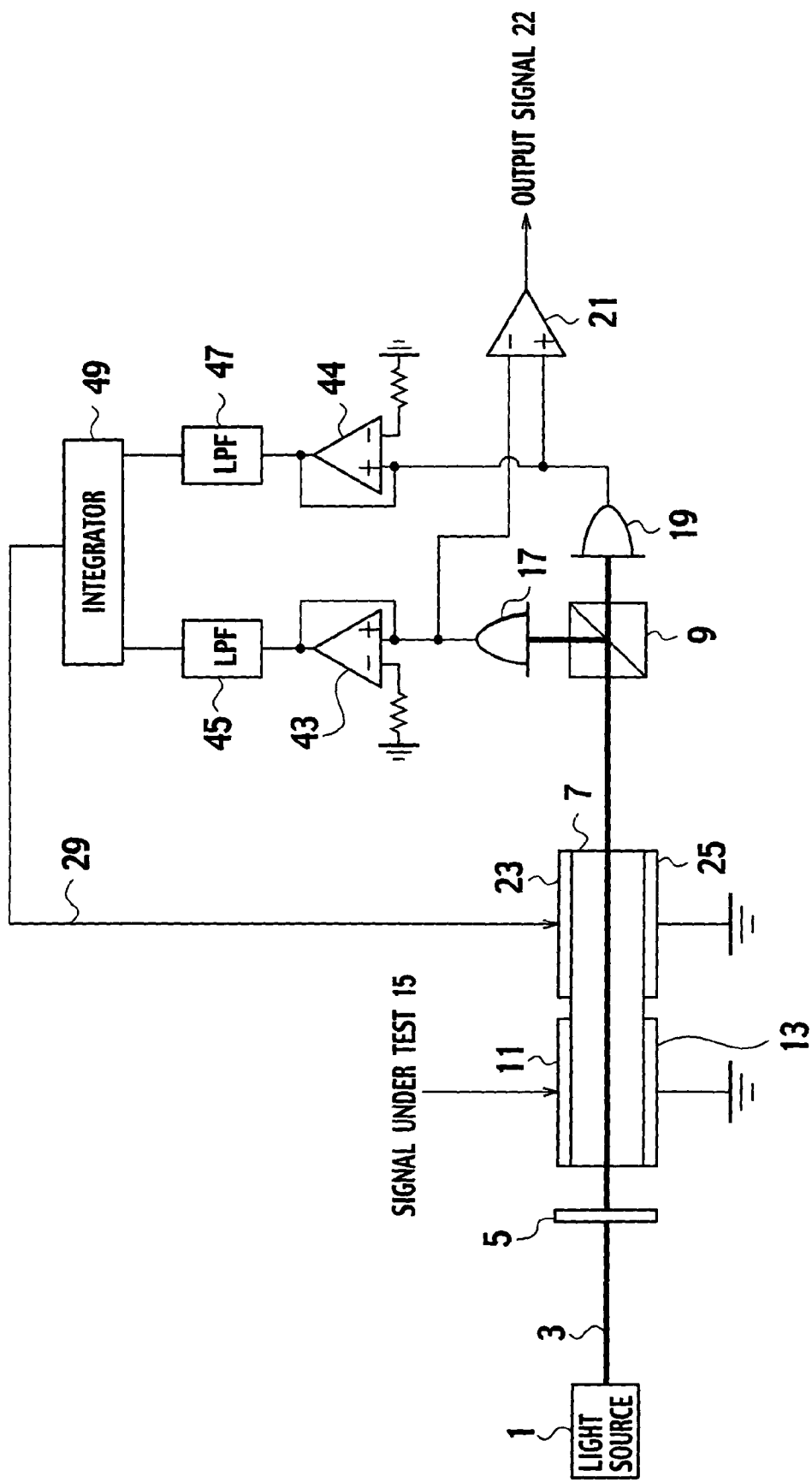
FIG. 18 is a diagram showing a configuration of an electric field sensor according to a sixth embodiment of the present invention.

FIG. 18 is a diagram showing a configuration of an electric field sensor according to a sixth embodiment.

Like in the first and the second embodiments, the electric field sensor according to the sixth embodiment is configured such that an optical beam is input to an EO crystal to which an alternate current electric field is applied, a PBS splits light emitted from the EO crystal into an S polarized light and a P polarized light, and a differential amplifier detects a difference between intensities of the polarized lights.

Specifically, in FIG. 18, the optical beam 3 emitted from the light source 1 passes through the QWP 5 and the EO crystal 7, and is incident to the PBS 9. The QWP 5 adjusts the polarization state of the optical beam immediately before being incident to the PBS 9 such that the optical beam becomes a circularly polarized light at a predetermined ambient temperature. An electric field corresponding to the signal under test 15 (for example, an alternate current of a few kHz to a few hundred MHz) is applied to the EO crystal 7 via the signal electrode 11 and the ground electrode 13. The optical beam 3 is modulated in a polarizing manner within the EO crystal 7 according to the electric field. The PBS 9 splits the modulated light into an S polarized light component and a P polarized light component. In this case, each polarized light component is converted into an intensity-modulated light. The intensity-modulated S and P polarized light components change in mutually reverse phases. The PD 17 and the PD 19 receive the S and the P polarized light components respectively, and the differential amplifier 21 differentiates the outputs from both PDs, thereby obtaining the output signal 22.

According to the sixth embodiment, the electric field sensor generates a control signal having a voltage corresponding to a direct current component included in the output signal, and gives the control signal to a control electrode provided in the EO crystal. In FIG. 18, while the control signal is generated from the input signal to the differential amplifier 21, the control signal can be also generated from the output signal 22 from the differential amplifier 21.

As shown in FIG. 18, the electric field sensor includes a buffer amplifier 43 connected to the PD 17, a buffer amplifier 44 connected to the PD 19, a low-pass filter (hereinafter referred to as an "LPF") 45 connected to the output of the buffer amplifier 43, an LPF 47 connected to the output of the buffer amplifier 44, and an integrator 49 that takes a difference between outputs from the LPF 45 and the LPF 47, and integrates the difference. The EO crystal 7 includes the control electrode 23 and the control ground electrode 25 as control signal giving means. An output voltage from the integrator 49 is applied to between the control electrode 23 and the control ground electrode 25. The LPF 45 and the LPF 47 input respectively only a signal of an extremely low frequency component (a direct current component) attributable to a change in the environmental temperature, to the integrator. Therefore, only a drift due to a temperature change is decreased. On the other hand, since the LPF 45 and the LPF 47 interrupt respectively a signal of a high-frequency component attributable to the signal under test 15, this signal of a high-frequency component is not input to the integrator 49. The integrator 49 integrates a difference between two signals having only the low-frequency component, and outputs the integrated result as the control signal 29. The PD 17 and the PD 19 give signals including both a low-frequency component and a high-frequency component, to the differential amplifier 21.

Figure 19:
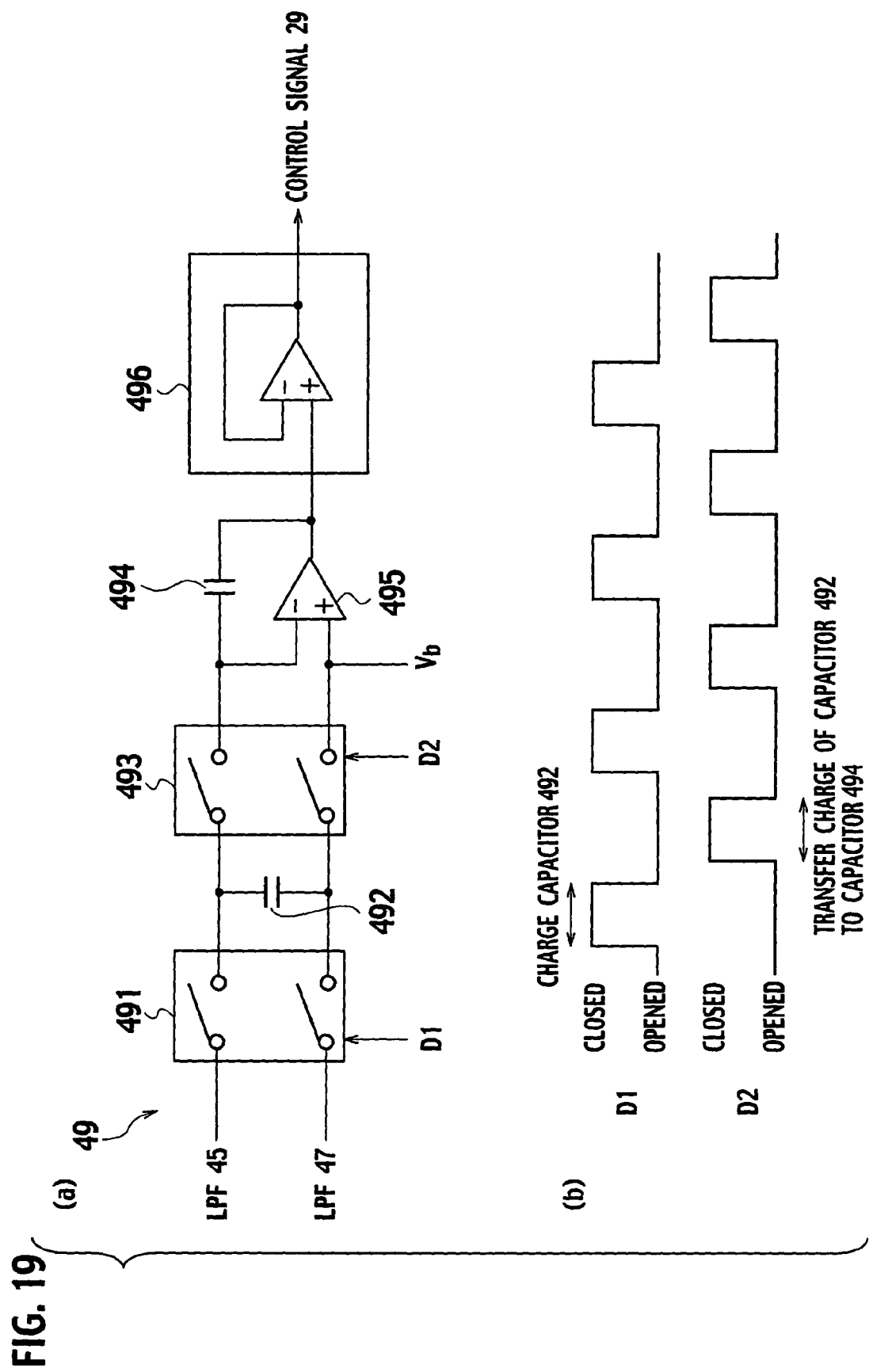
FIGS. 19(a) and 19(b) are a circuit diagram of an integrator (a switched capacitor integrator), and a waveform diagram of a drive signal, respectively.

FIG. 19(a) is a circuit diagram of the integrator 49 (a switched capacitor integrator), and FIG. 19(b) is a waveform diagram of a drive signal for driving the integrator 49.

The integrator 49 as a switched capacitor integrator includes: a switch 491 made of coupled two switches, with one end of one switch being connected to the LPF 45, and one end of the other switch being connected to the LPF 47; a capacitor 492 that is connected to between the other end of the one switch and other end of the other switch of the switch 491; a switch 493 made of coupled two switches, with one end of one switch and one end of the other switch being connected respectively to the capacitor 492; a differential amplifier 495, to a minus input terminal of which the other end of one switch of the switch 493 is connected, and to a plus input terminal of which the other end of the other switch of the switch 493 is connected, with the plus input terminal being biased at a voltage Vb; a capacitor 494 that is connected to between the minus input terminal and the output terminal of the differential amplifier 495; and a buffer amplifier 496 that is connected to between the output terminal of the differential amplifier 495 and the control electrode 29. It is noted that (the capacitance of the capacitor 492)<<(the capacitance of the capacitor 494). When the differential amplifier 495 is a positive and negative power source type, this differential amplifier may be used by grounding the plus input terminal, without applying a bias.

A drive signal D1 is given to the switch 491 and a drive signal D2 is given to the switch 493 such that the switch 491 and the switch 493 are closed alternately, instead of closing at the same time. Therefore, after the capacitor 492 is charged, the charge is transferred to the capacitor 494. Consequently, the differential amplifier 495 outputs a signal of a voltage proportional to the integrated value of a difference between the signals output from the LPF 45 and the LPF 47. The signal of this voltage passes through the buffer amplifier 496, and is given to the control electrode 23 as the control signal 29. In other words, the control signal 29 has a voltage corresponding to the direct current component of the output signal 22, and is given to the control electrode 23.

A layout of the electrodes according to the sixth embodiment is the same as the layout of the electrodes according to the third embodiment explained with reference to FIGS. 13(a) to 13(e).

In the electric field sensor according to the sixth embodiment having the above configuration, the integrator 49 (control signal generating means) generates the control signal 29 having a voltage corresponding to a direct current component included in the output signal 22. When the control signal 29 is given to the control electrode 23, not only the electric field of the signal under test 15 but also the electric field of the control signal 29 is applied to the EO crystal 7. Based on the electric field of the control signal 29, the polarization state of the optical beam can be corrected to a circularly polarized light. Further, optical intensity noise can be sufficiently reduced.

Seventh Embodiment

Figure 20:
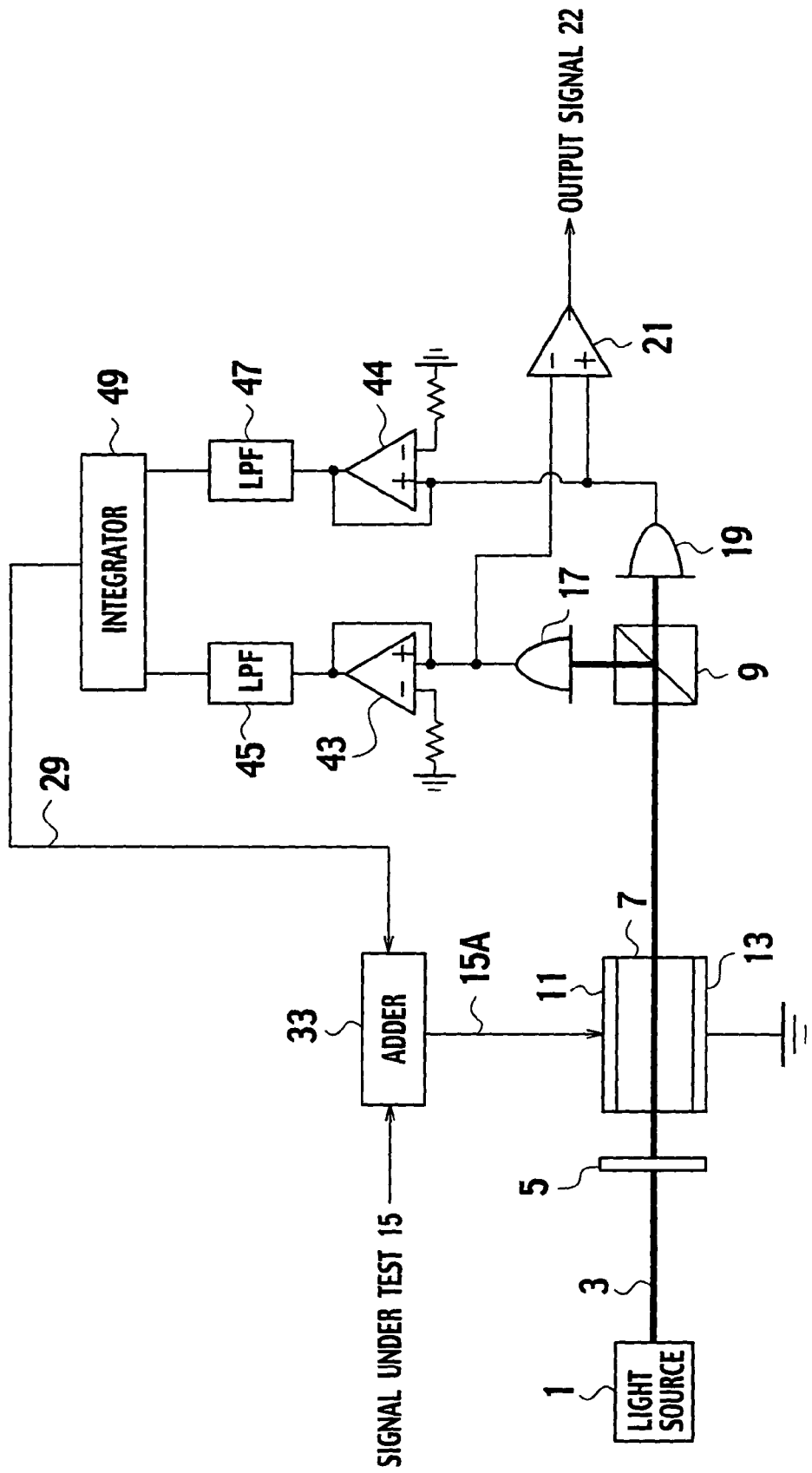
FIG. 20 is a diagram showing a configuration of an electric field sensor according to a seventh embodiment of the present invention.

FIG. 20 is a diagram showing a configuration of an electric field sensor according to a seventh embodiment.

A difference between the electric field sensor according to the present embodiment and that according to the sixth embodiment is mainly explained below, and explanation of identical configurations is omitted.

The electric field sensor according to the seventh embodiment does not have the control electrode 23 and the control ground electrode 25 in the EO crystal 7. Only the signal electrode 11 and the ground electrode 13 are provided as electrodes. The electric field sensor according to the seventh embodiment has the adder 33 that adds a control signal 29 to the signal under test 15. The adder 33 gives the signal under test 15A after the addition, to the signal electrode 11. The adder 33 corresponds to the control signal giving means.

The configuration of the adder 33 according to the seventh embodiment is similar to the configuration of the adder 33 according to the fourth embodiment explained with reference to FIG. 15.

In the electric field sensor according to the seventh embodiment having the above configuration, the integrator 49 (control signal generating means) generates the control signal 29 having a voltage corresponding to a direct current component included in the output signal 22. When the control signal 29 is given to the adder 33, not only the electric field of the signal under test 15 but also the electric field of the control signal 29 is applied to the EO crystal 7. Based on the electric field of the control signal 29, the polarization state of the optical beam can be corrected to a circularly polarized light. Further, optical intensity noise can be sufficiently reduced.

Eighth Embodiment

Figure 21:
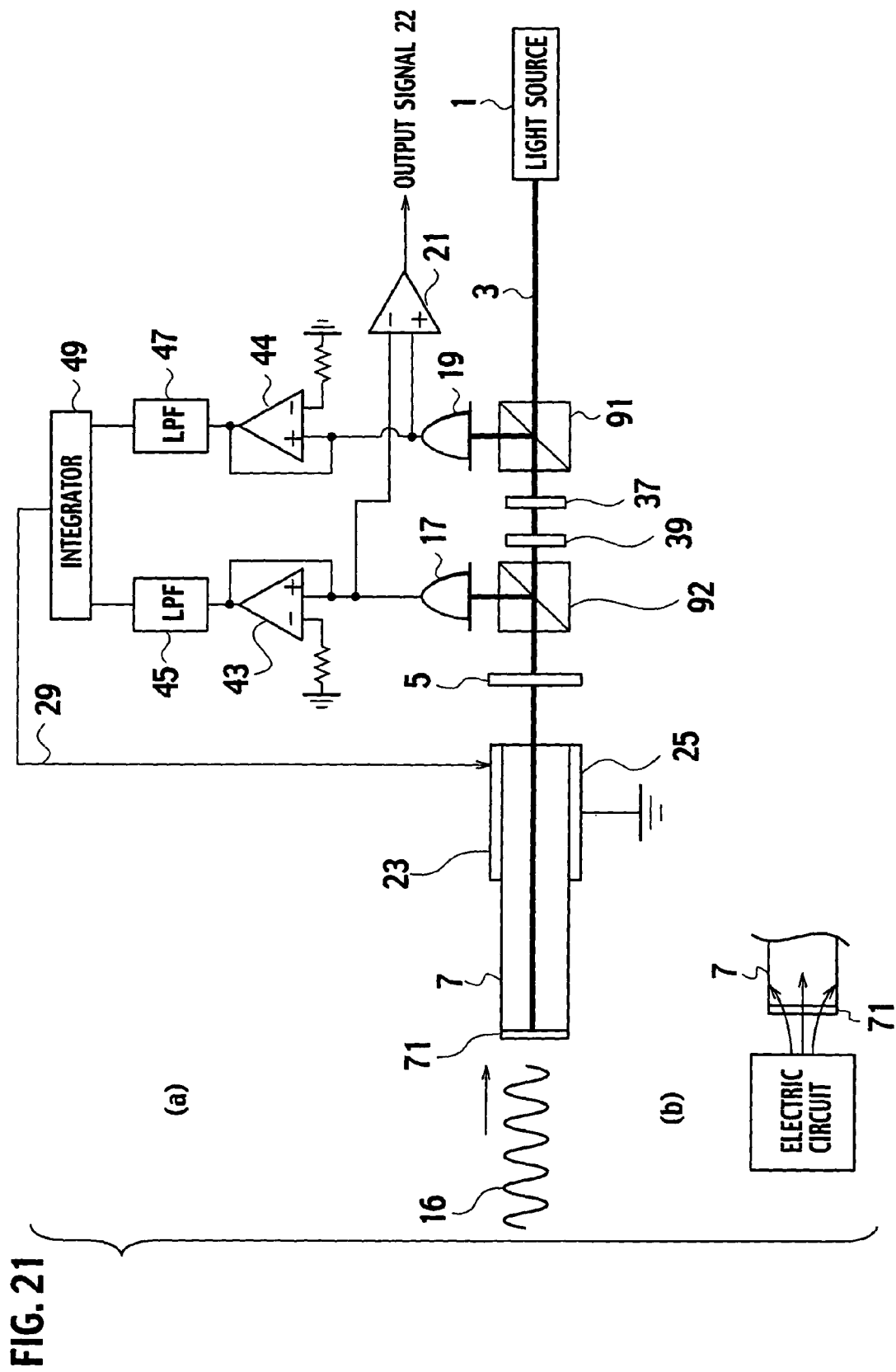
FIGS. 21(a) and 21(b) are diagrams showing a configuration of an electric field sensor according to an eighth embodiment of the present invention.

FIG. 21(a) is a diagram showing a configuration of an electric field sensor according to an eighth embodiment.

The electric field sensor according to the eighth embodiment is used to measure an electric wave, and therefore, has a reflection optical system. A difference between the electric field sensor according to the present embodiment and that according to the sixth embodiment is mainly explained below, and explanation of identical configurations is omitted.

The electric field sensor according to the eighth embodiment does not measure the signal under test 15 given to the electrode provided in the EO crystal 7, but measures an electric wave under test that is directly incident to the EO crystal 7 after being propagated in space or an electric field that is generated from an electric circuit under test as shown in FIG. 21(b). Therefore, the electric field sensor does not have the signal electrode 11 and the ground electrode 13.

The electric field sensor has the PBSs 91 and 92 in this order on route from the light source 1 to the EO crystal 7, in place of the PBS 9. The QWP 5 is provided between the PBS 92 and the EO crystal 7. The HWP 37 and the Faraday rotator 39 are provided between the PBS 91 and the PBS 92. The dielectric mirror 71 is provided on the surface of the EO crystal 7 opposite to the incident surface of an optical beam. The electric wave under test 16 is incident to the surface of the dielectric mirror 71.

In the electric field sensor according to the third embodiment having the above configuration, the optical beam 3 from the light source 1 passes through the PBS 91, the HWP 37, the Faraday rotator 39, the PBS 92, and the QWP 5, and is incident to the EO crystal 7. The optical beam 3 is reflected from the dielectric mirror 71, is emitted from the EO crystal 7, is adjusted to be in a suitable polarization state by the QWP 5, and is incident to the PBS 92. The PBS 92 splits the optical beam 3 into an S polarized light component and a P polarized light component. The S polarized light component is incident to the PD 17. On the other hand, the Faraday rotator 39 and the HWP 37 convert the P polarized light component that passes through the PBS 92 into an S polarized light. The S polarized light is incident to the PBS 91. The PBS 91 inputs the S polarized light component to the PD 19.

The layout of electrodes according to the eighth embodiment is similar to the layout of the electrodes according to the fifth embodiment explained with reference to FIGS. 17(a) to 17(c).

In the electric field sensor according to the eighth embodiment having the above configuration, the integrator 49 generates the control signal 29 having a voltage corresponding to a direct current component included in the output signal 22, in a similar manner to that according to the sixth embodiment. When the control signal 29 is given to the control electrode 23, not only the electric field of the signal under test 15 but also the electric field of the control signal 29 is applied to the EO crystal 7. The polarization state of the light incident to the PBS 92 is suitably adjusted, and intensities of light incident to the PD 17 and the PD 19 can be made equal. Further, optical 10 intensity noise can be sufficiently reduced.

Electric field sensors that can prevent a reflection return light from entering the laser light source according to ninth to fourteenth embodiments are explained next.

Ninth Embodiment

Figure 22:
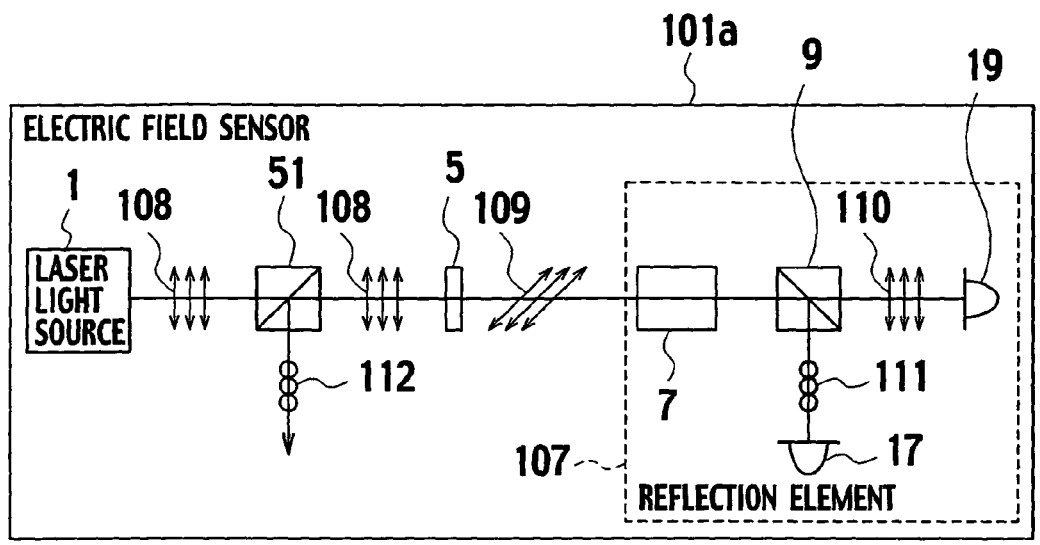
FIG. 22 is a diagram showing a configuration of an electric field sensor according to a ninth embodiment of the present invention.

FIG. 22 is a diagram showing a configuration of an electric field sensor according to the ninth embodiment.

An electric field sensor 101a has the laser light source 1, the QWP 5, the EO crystal 7, the PBS 9, the PD 17, the PD 19, and a second PBS 51 provided between the laser light source 1 and the QWP 5. An electrode that applies a voltage to the EO crystal 7 based on a presence of an electric field to be detected is not described herein.

In the following explanations, the EO crystal 7, the PBS 9, and the PDs 17 and 19 are collectively called the reflection element 107, for the sake of convenience.

In measuring an electric field with the electric field sensor 101a, the laser light source 1 irradiates the P polarized light 108. The QWP 5 converts the P polarized light 108 into a circularly polarized light 109.

The EO crystal 7 modulates the circularly polarized light 109 in a polarizing manner, and the PBS 9 splits the modulated light into a P polarized light (component) 110 and an S polarized light (component) 111. The PD 19 receives the P polarized light 110, and converts the light into an electric signal. On the other hand, the PD 17 receives the S polarized light 111, and converts the light into an electric signal. A differential amplifier or the like (not shown) differentially amplifies these electric signals. An electric field is measured based on the differentially amplified results.

Figure 23:
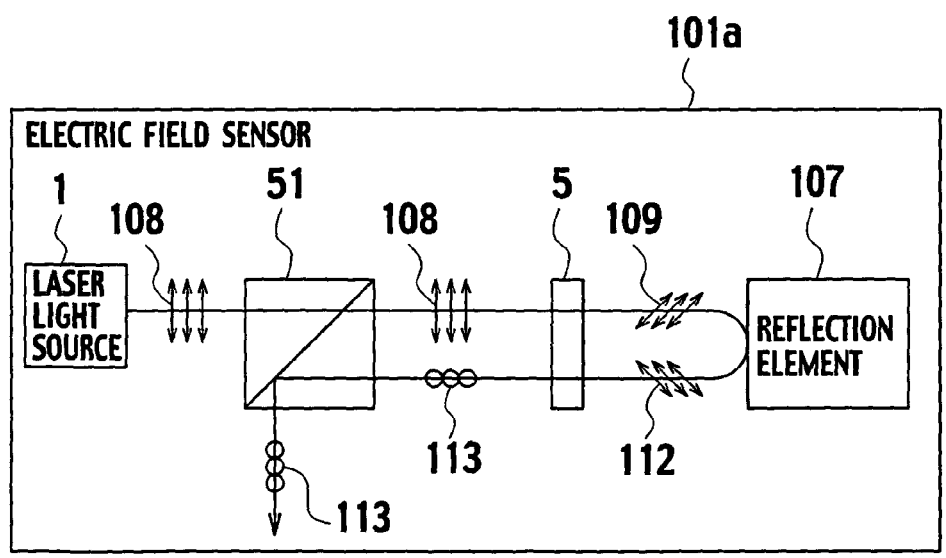
FIG. 23 is a diagram for explaining a basic principle of the electric field sensor shown in FIG. 22.

FIG. 23 is a diagram for explaining a basic principle of the electric field sensor 101a shown in FIG. 22. In the drawing, the reflection element 107 is regarded as a mirror.

The QWP 5 converts a reflection return light (a circularly polarized light) 112 generated by the reflection element 107 into an S polarized light 113. The PBS 51 splits the S polarized light 113 in a polarizing manner.

As described above, the PBS 51 splits the reflection return light (the S polarized light) 113 in a polarizing manner, thereby preventing the reflection return light 113 from being incident to the laser light source 1.

In the present embodiment, while the electric field sensor 101a has the PBS 51 as means (polarizing split means) for splitting the reflection return light (the S polarized light) in a polarizing manner, the electric field sensor 101a may have other configurations. For example, the electric field sensor 101a may have an element like the Glan-Thompson prism or the Wollaston prism that splits two independent linear polarized lights in space, or an element like a polarization plate that passes only a specific linearly polarized light.

Tenth Embodiment

Figure 24:
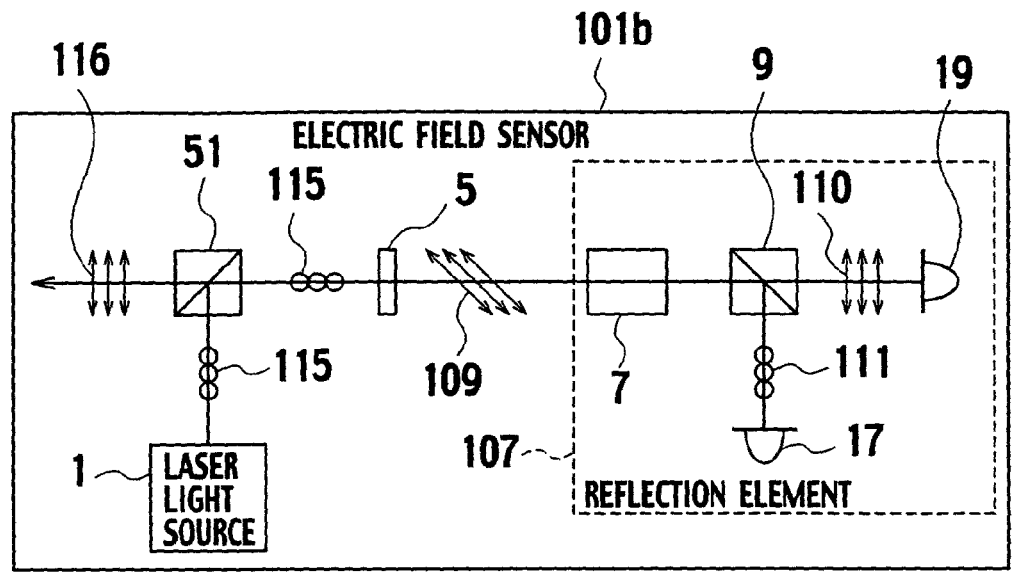
FIG. 24 is a diagram showing a configuration of an electric field sensor according to a tenth embodiment of the present invention.

FIG. 24 is a diagram showing a configuration of an electric field sensor according to the tenth embodiment.

An electric field sensor 101b has the laser light source 1, the QWP 5, the EO crystal 7, the PBS 9, the PD 17, the PD 19, and the second PBS 51.

The electric field sensor 101b is different from the electric field sensor 101a shown in FIG. 22 in that the position of the laser light source 1 is changed.

In measuring an electric field with the electric field sensor 101b, the laser light source 1 irradiates an S polarized light 115. The PBS 51 inputs the S polarized light 115 to the QWP 5, and the QWP 5 converts the S polarized light 115 into the circularly polarized light 109.

The EO crystal 7 modulates the circularly polarized light 109 in a polarizing manner, and the PBS 9 splits the modulated light into the P polarized light (component) 110 and the S polarized light (component) 111. The PD 19 receives the P polarized light 110, and converts the light into an electric signal. On the other hand, the PD 17 receives the S polarized light 111, and converts the light into an electric signal. A differential amplifier or the like (not shown) differentially amplifies these electric signals. An electric field is measured based on the differentially amplified results.

In the following explanations, the EO crystal 7, the PBS 9, and the PDs 17 and 19 are collectively called the reflection element 107, for the sake of convenience.

Figure 25:
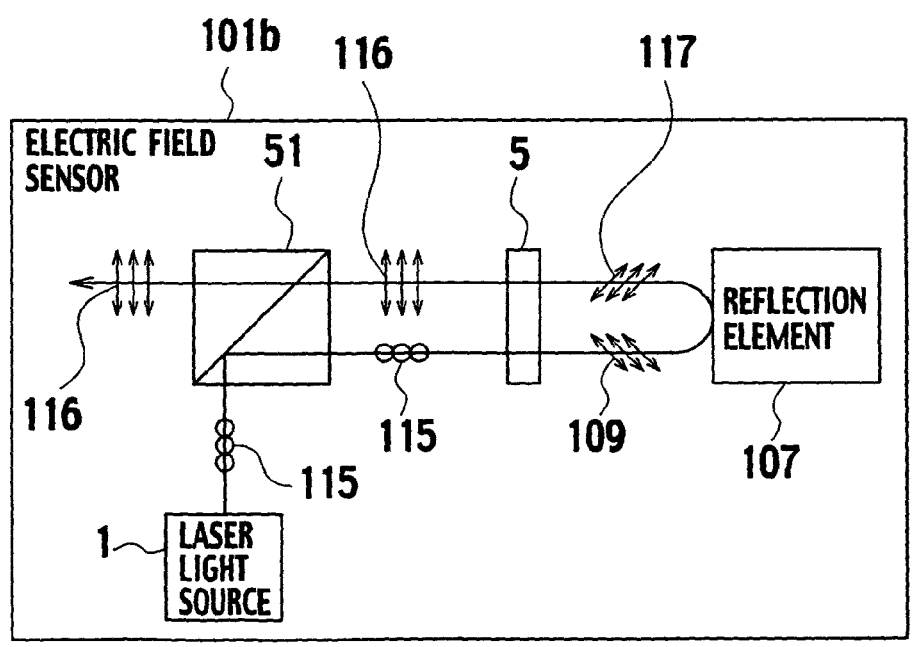
FIG. 25 is a diagram for explaining a basic principle of the electric field sensor shown in FIG. 24.

FIG. 25 is a diagram for explaining a basic principle of the electric field sensor 101b shown in FIG. 24. In the drawing, the reflection element 107 is regarded as a mirror.

The QWP 5 converts a reflection return light (a circularly polarized light) 117 generated by the reflection element 107 into a P polarized light 116. The PBS 51 splits the P polarized light 116 in a polarizing manner.

As described above, a laser light emitted from the laser light source can be the S polarized light 115. The PBS 51 splits the reflection return light (the P polarized light) 116 in a polarizing manner, thereby preventing the reflection return light 116 from being incident to the laser light source 1.

In the present embodiment, while the electric field sensor 101b has the PBS 51 as means (polarizing split means) for splitting the reflection return light (the P polarized light) in a polarizing manner, the electric field sensor 101b may have other configurations. For example, the electric field sensor 101b may have an element like the Glan-Thompson prism or the Wollaston prism that splits two independent linear polarized lights in space.

Eleventh Embodiment

Figure 26:
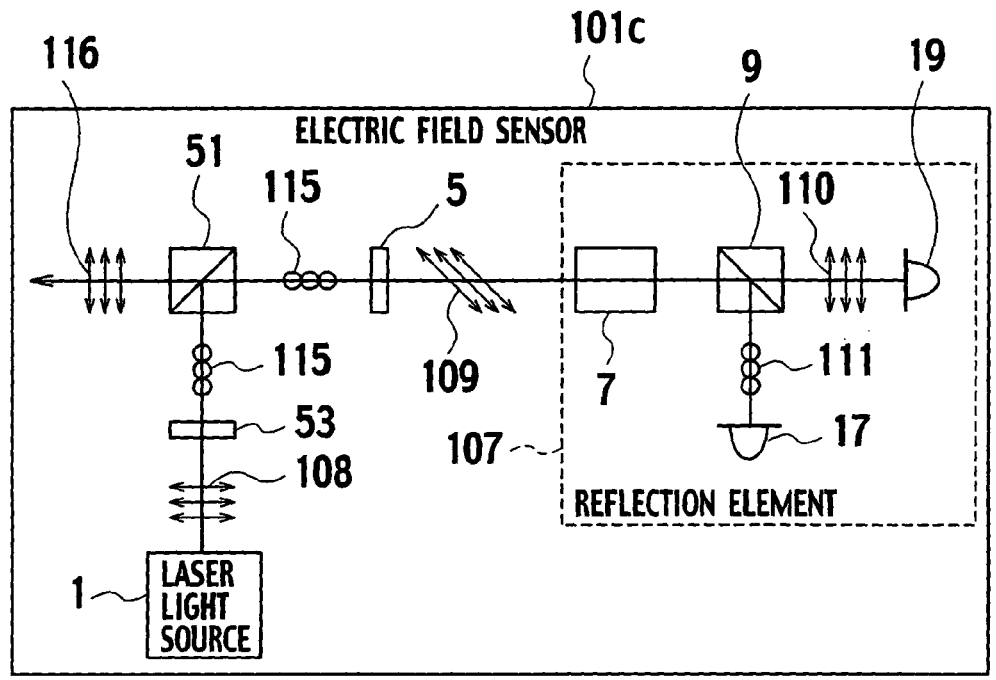
FIG. 26 is a diagram showing a configuration of an electric field sensor according to an eleventh embodiment of the present invention.

FIG. 26 is a diagram showing a configuration of an electric field sensor according to the eleventh embodiment.

An electric field sensor 101c has the laser light source 1, the QWP 5, the EO crystal 7, the PBS 9, the PD 17, the PD 19, the second PBS 51, and an HWP 53.

The electric field sensor 101c is different from the electric field sensor 101b shown in FIG. 24 in that the HWP 53 is provided between the laser light source 1 and the PBS 51.

In measuring an electric field with the electric field sensor 101c, the laser light source 1 irradiates the P polarized light 108. The HWP 53 converts the P polarized light 108 into the S polarized light 115. The PBS 51 inputs the S polarized light 115 to the QWP 5, and the QWP 5 converts the S polarized light 115 into the circularly polarized light 109.

The EO crystal 7 modulates the circularly polarized light 109 in a polarizing manner, and the PBS 9 splits the modulated light into the P polarized light (component) 110 and the S polarized light (component) 111. The PD 19 receives the P polarized light 110, and converts the light into an electric signal. On the other hand, the PD 17 receives the S polarized light 111, and converts the light into an electric signal. A differential amplifier or the like (not shown) differentially amplifies these electric signals. An electric field is measured based on the differentially amplified results.

In the following explanations, the EO crystal 7, the PBS 9, and the PDs 17 and 19 are collectively called the reflection element 107, for the sake of convenience.

Figure 27:
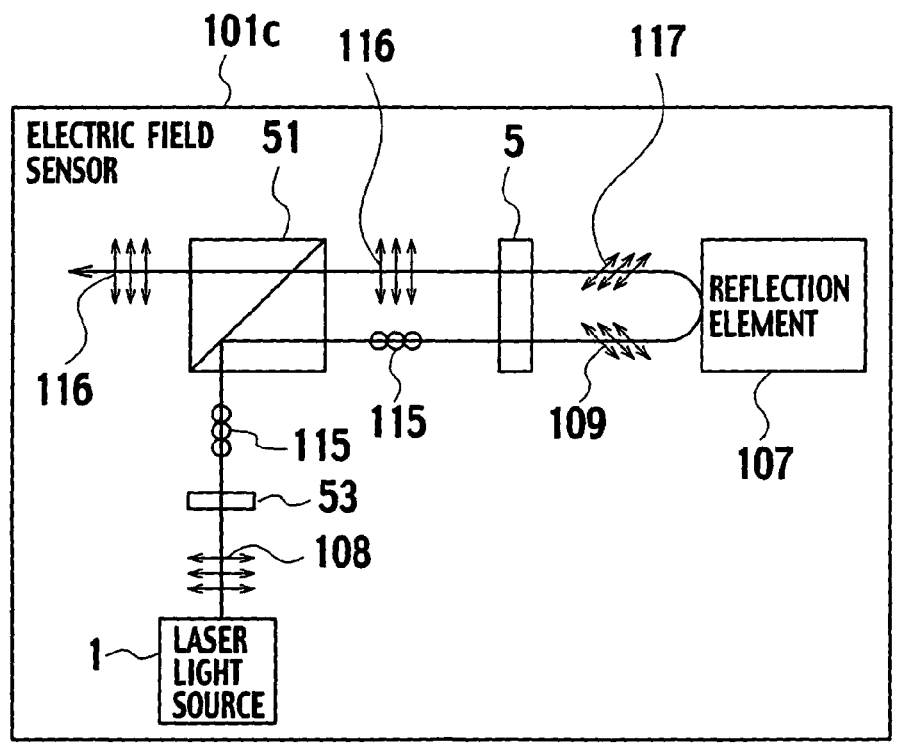
FIG. 27 is a diagram for explaining a basic principle of the electric field sensor shown in FIG. 26.

FIG. 27 is a diagram for explaining a basic principle of the electric field sensor 101c shown in FIG. 26. In the drawing, the reflection element 107 is regarded as a mirror.

The QWP 5 converts the reflection return light (the circularly polarized light) 117 generated by the reflection element 107 into the P polarized light 116. The PBS 51 splits the P polarized light 116 in a polarizing manner.

As described above, the P polarized light 108 emitted from the laser light source 1 can be converted into the S polarized light 115, and thereafter, the S polarized light 115 can be input to the EO crystal 7. Also, the PBS 51 can split the reflection return light (the P polarized light) 116 in a polarizing manner, thereby preventing the reflection return light 116 from being incident to the laser light source 1.

In the present embodiment, while the electric field sensor 101c has the PBS 51 as means (polarizing split means) for splitting the reflection return light (the P polarized light) in a polarizing manner, the electric field sensor 101c may have other configurations. For example, the electric field sensor 101c may have an element like the Glan-Thompson prism or the Wollaston prism that splits two independent linear polarized lights in space.

Twelfth Embodiment

Figure 28:
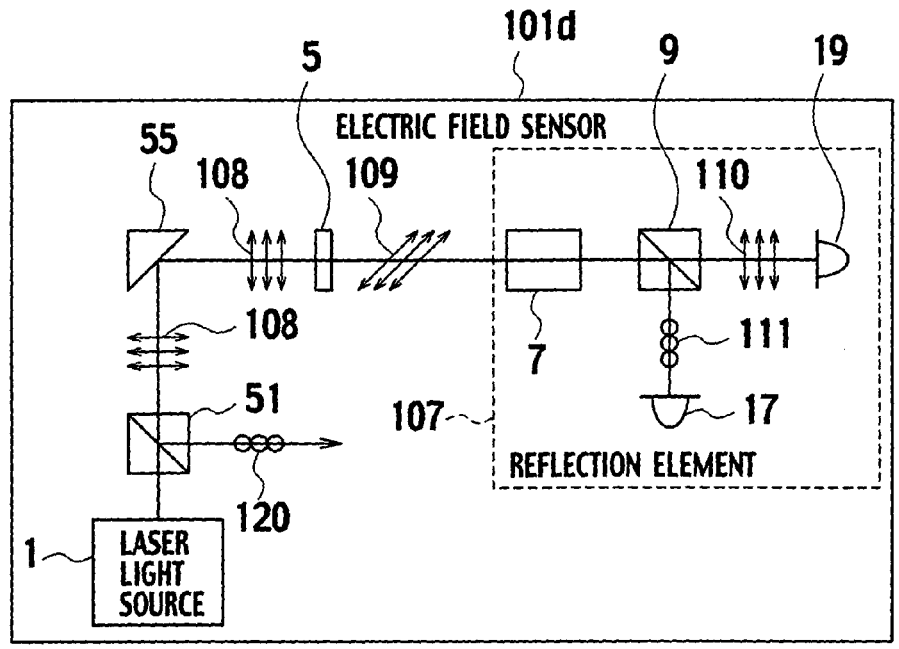
FIG. 28 is a diagram showing a configuration of an electric field sensor according to a twelfth embodiment of the present invention.

FIG. 28 is a diagram showing a configuration of an electric field sensor according to the twelfth embodiment.

An electric field sensor 101d has the laser light source 1, the QWP 5, the EO crystal 7, the PBS 9, the PD 17, the PD 19, the second PBS 51, and a prism 55.

The electric field sensor 101d has the prism 55 in the electric field sensor 101a shown in FIG. 22.

In measuring an electric field with the electric field sensor 101d, the laser light source 1 irradiates the P polarized light 108. The prism 55 changes a proceeding direction of the P polarized light 108, thereby inputting the light to the QWP 5. The QWP 5 converts the P polarized light 108 into the circularly polarized light 109.

The EO crystal 7 modulates the circularly polarized light 109 in a polarizing manner, and the PBS 9 splits the modulated light into the P polarized light (component) 110 and the S polarized light (component) 111. The PD 19 receives the P polarized light 110, and converts the light into an electric signal. On the other hand, the PD 17 receives the S polarized light 11, and converts the light into an electric signal. A differential amplifier or the like (not shown) differentially amplifies these electric signals. An electric field is measured based on the differentially amplified results.

In the following explanations, the EO crystal 7, the PBS 9, and the PDs 17 and 19 are collectively called the reflection element 107, for the sake of convenience.

Figure 29:
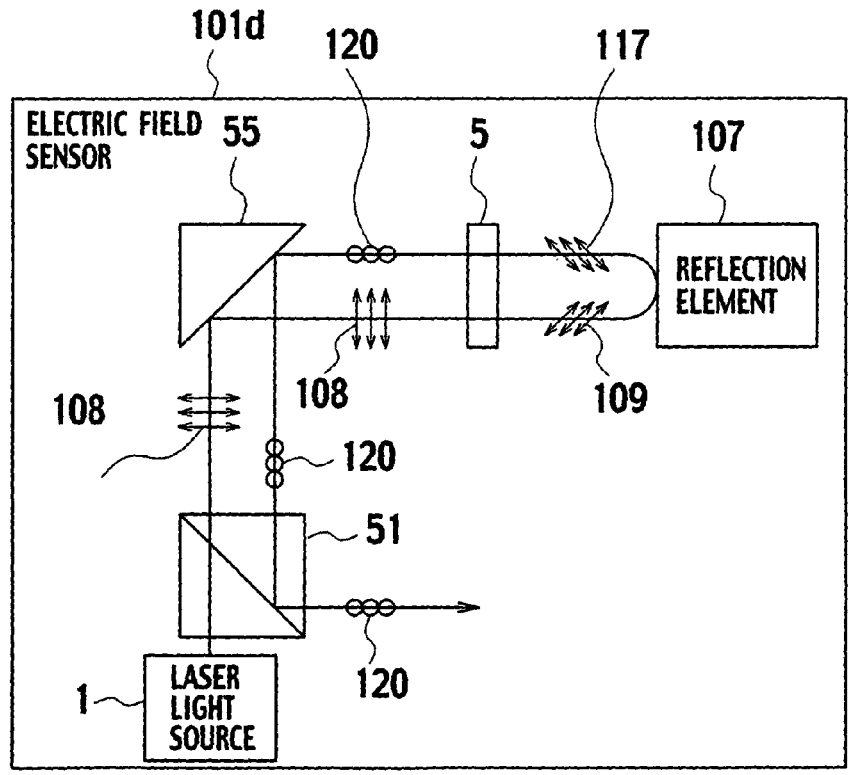
FIG. 29 is a diagram for explaining a basic principle of the electric field sensor shown in FIG. 28.

FIG. 29 is a diagram for explaining a basic principle of the electric field sensor 101d shown in FIG. 28. In the drawing, the reflection element 107 is regarded as a mirror.

The QWP 5 converts the reflection return light (the circularly polarized light) 117 generated by the reflection element 107 into an S polarized light 120. The prism 55 changes the proceeding direction of the S polarized light 120, thereby inputting the light to the PBS 51. The PBS 51 splits the S polarized light 120 in a polarizing manner.

As described above, the proceeding direction of the P polarized light 108 is changed, and thereafter, this light is input to the QWP 5. Then, the proceeding direction of the reflection return light (the S polarized light) 120 is changed, and thereafter, this light is input to the PBS 51. With this arrangement, the degree of freedom in disposing the laser light source increases. Further, the PBS 51 splits the reflection return light 120 in a polarizing manner, thereby preventing the reflection return light 120 from being incident to the laser light source 1.

In the present embodiment, while the electric field sensor 101d has the PBS 51 as means (polarizing split means) for splitting the reflection return light (the S polarized light) in a polarizing manner, the electric field sensor 101d may have other configurations. For example, the electric field sensor 101d may have an element like the Glan-Thompson prism or the Wollaston prism that splits two independent linear polarized lights in space, or an element like a polarization plate that passes only a specific linearly polarized light.

Thirteenth Embodiment

Figure 30:
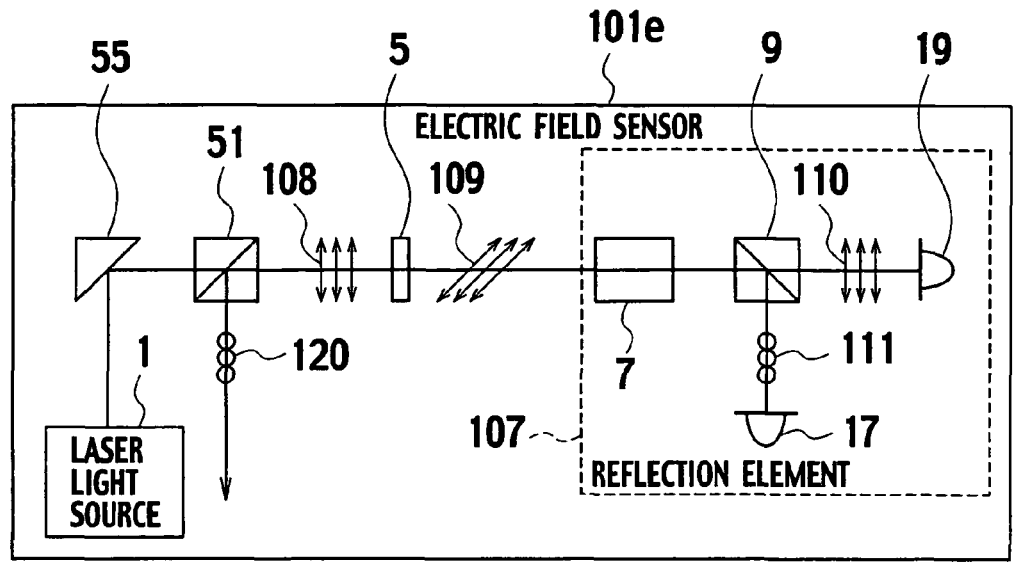
FIG. 30 is a diagram showing a configuration of an electric field sensor according to a thirteenth embodiment of the present invention.

FIG. 30 is a diagram showing a configuration of an electric field sensor according to the thirteenth embodiment.

An electric field sensor 101e has the laser light source 1, the QWP 5, the EO crystal 7, the PBS 9, the PD 17, the PD 19, the second PBS 51, and the prism 55.

The electric field sensor 101e is different from the electric field sensor 101d shown in FIG. 28 in that the position of the prism 55 is changed and is disposed adjacent to the laser light source 1.

In measuring an electric field with the electric field sensor 101e, the laser light source 1 irradiates the P polarized light 108. The prism 55 changes a proceeding direction of the P polarized light 108, thereby inputting the light to the QWP 5. The QWP 5 converts the P polarized light 108 into the circularly polarized light 109.

The EO crystal 7 modulates the circularly polarized light 109 in a polarizing manner, and the PBS 9 splits the modulated light into the P polarized light (component) 110 and the S polarized light (component) 111. The PD 19 receives the P polarized light 110, and converts the light into an electric signal. On the other hand, the PD 17 receives the S polarized light 111, and converts the light into an electric signal. A differential amplifier or the like (not shown) differentially amplifies these electric signals. An electric field is measured based on the differentially amplified results.

In the following explanations, the EO crystal 7, the PBS 9, and the PDs 17 and 19 are collectively called the reflection element 107, for the sake of convenience.

Figure 31:
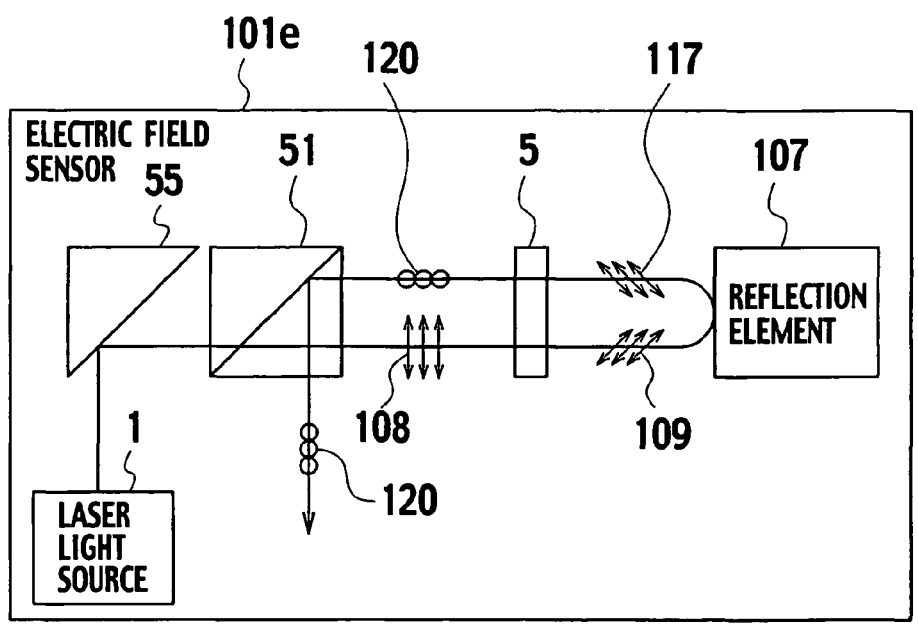
FIG. 31 is a diagram for explaining a basic principle of the electric field sensor shown in FIG. 30.

FIG. 31 is a diagram for explaining a basic principle of the electric field sensor 101e shown in FIG. 30. In the drawing, the reflection element 107 is regarded as a mirror.

The QWP 5 converts the reflection return light (the circularly polarized light) 117 generated by the reflection element 107 into the S polarized light 120, and inputs the S polarized light 120 to the PBS 51. The PBS 51 splits the S polarized light 120 in a polarizing manner.

As described above, the proceeding direction of the P polarized light 108 is changed, and thereafter, this light is input to the QWP 5. With this arrangement, the degree of freedom in disposing the laser light source increases. Further, the PBS 51 splits the reflection return light 120 in a polarizing manner, thereby preventing the reflection return light 120 from being incident to the laser light source 1.

In the present embodiment, while the electric field sensor 101e has the PBS 51 as means (polarizing split means) for splitting the reflection return light (the S polarized light) in a polarizing manner, the electric field sensor 101e may have other configurations. For example, the electric field sensor 101e may have an element like the Glan-Thompson prism or the Wollaston prism that splits two independent linear polarized lights in space, or an element like a polarization plate that passes only a specific linearly polarized light.

Fourteenth Embodiment

In the ninth to the thirteenth embodiments, a reflected light on the incident surface of the EO crystal is mainly described. In this fourteenth embodiment, a reflected light on the light receiving surface of the PD is described. An electric field sensor is designed such that light reflected from the light receiving surface of the PD is not returned to the laser light source.

Figure 32:
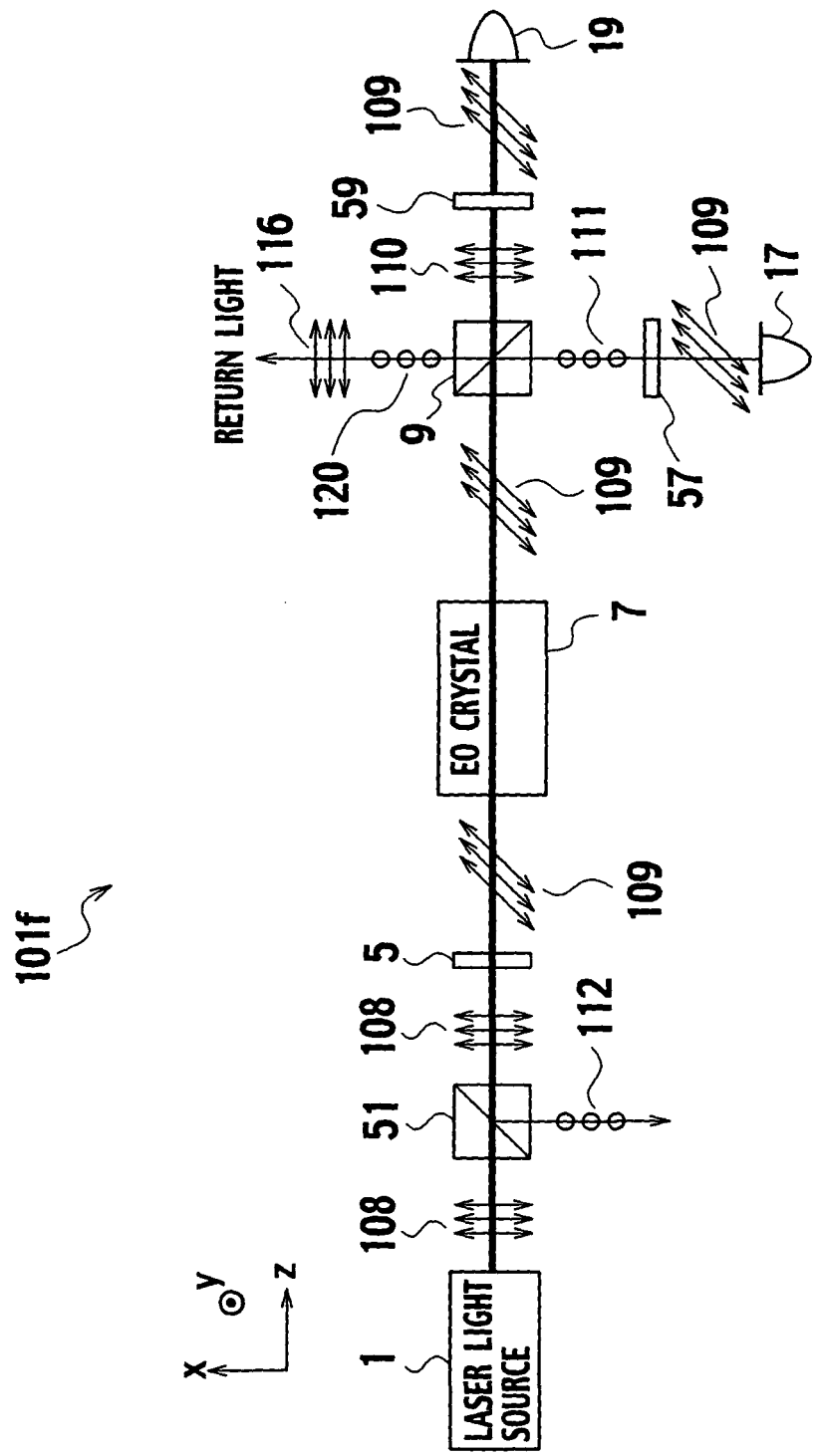
FIG. 32 is a diagram showing a configuration of an electric field sensor according to a fourteenth embodiment of the present invention.

FIG. 32 is a diagram showing a configuration of an electric field sensor according to the fourteenth embodiment.

A difference between the electric field sensor according to the present embodiment and that according to the ninth embodiment is explained below, and explanation of identical configurations is omitted.

An electric field sensor 101f according to the fourteenth embodiment has a QWP 57 between the PBS 9 and the PD 17, and has a QWP 59 between the PBS 9 and the PD 19.

In the electric field sensor 101f having the above configuration, of the circularly polarized light 109 from the EO crystal 7, the P polarized light 110 passes through the PBS 9, and the S polarized light 111 is reflected from the PBS 9.

The QWP 59 converts the P polarized light 110 that passes through the PBS 9 into the circularly polarized light 109. A part of the circularly polarized light 109 is reflected from the light receiving surface of the PD 19. However, the reflected circularly polarized light 109 passes through the QWP 59 again, and is converted into the S polarized light 120. The S polarized light 120 is reflected from the PBS 9. In other words, the light reflected from the light receiving surface of the PD 19 can be prevented from returning to the light source 1.

On the other hand, the QWP 57 converts the S polarized light 111 that is reflected from the PBS 9 into the circularly polarized light 109. A part of the circularly polarized light 109 is reflected from the light receiving surface of the PD 17. However, the reflected circularly polarized light 109 passes through the QWP 57 again, and is converted into the P polarized light 116. The P polarized light 116 passes through the PBS 9. In other words, the light reflected from the light receiving surface of the PD 17 can be prevented from returning to the light source 1.

An electric field sensor that can obtain high sensitivity by increasing the amplitude of the electric field within the electro optic crystal according to a fifteenth embodiment is explained next.

Fifteenth Embodiment

Figure 1:
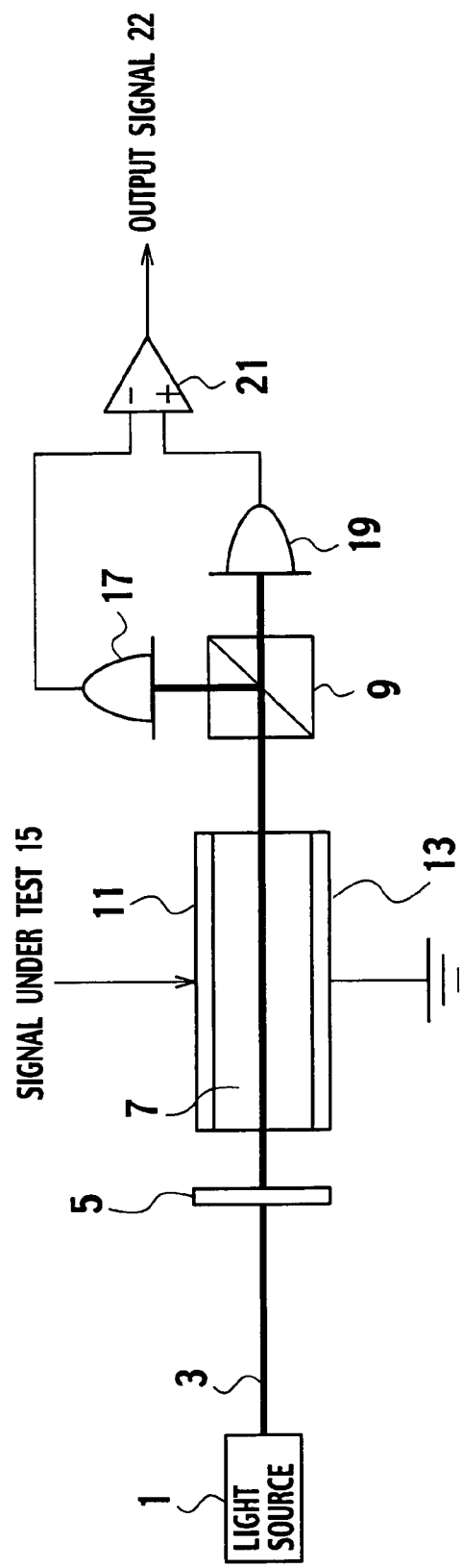
FIG. 1 is a block diagram showing a configuration of a conventional electric field sensor.
Figure 3:
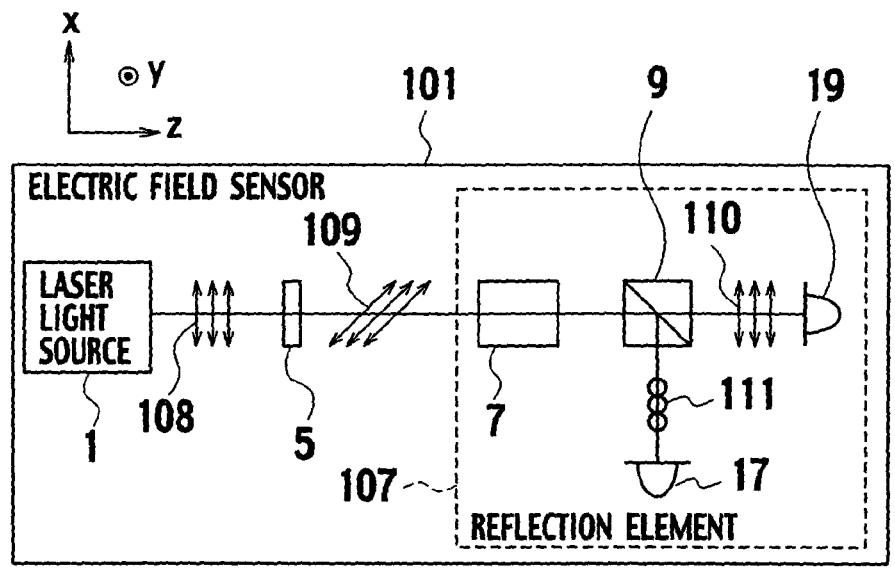
FIG. 3 is a diagram showing a configuration of the conventional electric field sensor.
Figure 4:
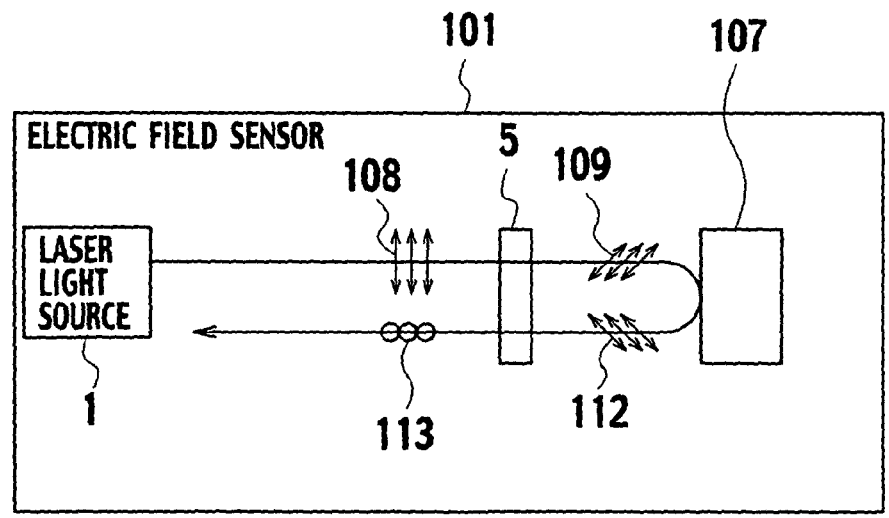
FIG. 4 is a diagram for explaining problems of the electric field sensor shown in FIG. 3.
Figure 5:
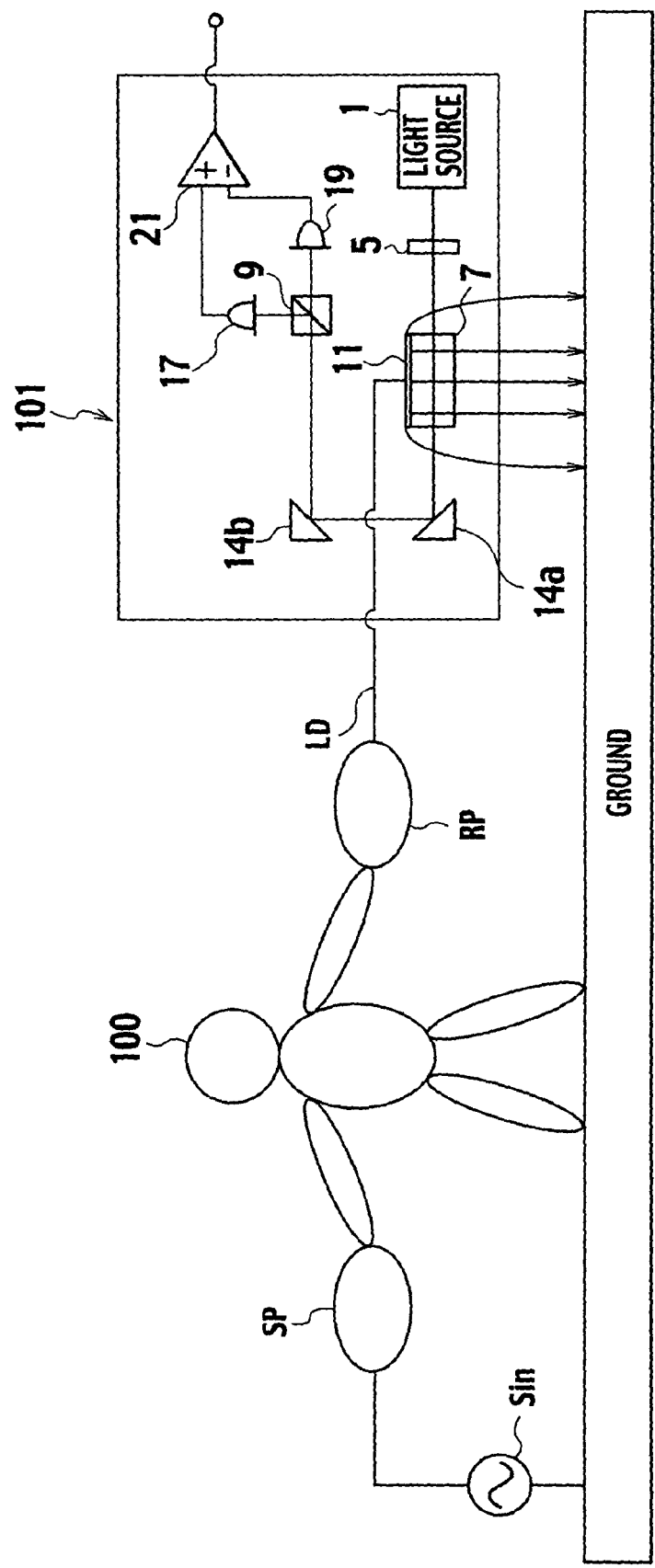
FIG. 5 is a diagram showing an example of a configuration of a conventional electric field sensor that is used to detect an electric signal of a human body.
Figure 6:
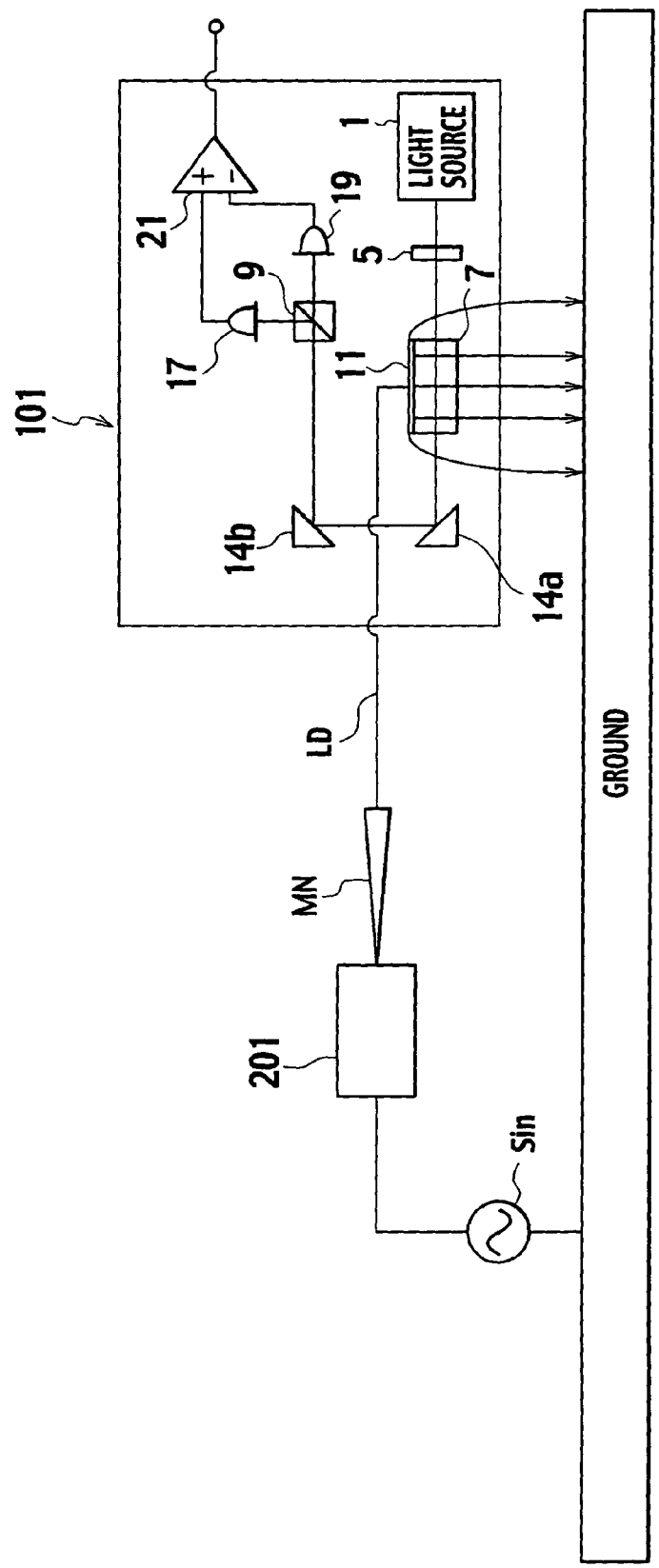
FIG. 6 is a diagram showing an example of a configuration of a conventional electric field sensor that is used to measure a voltage of a DUT.
Figure 33:
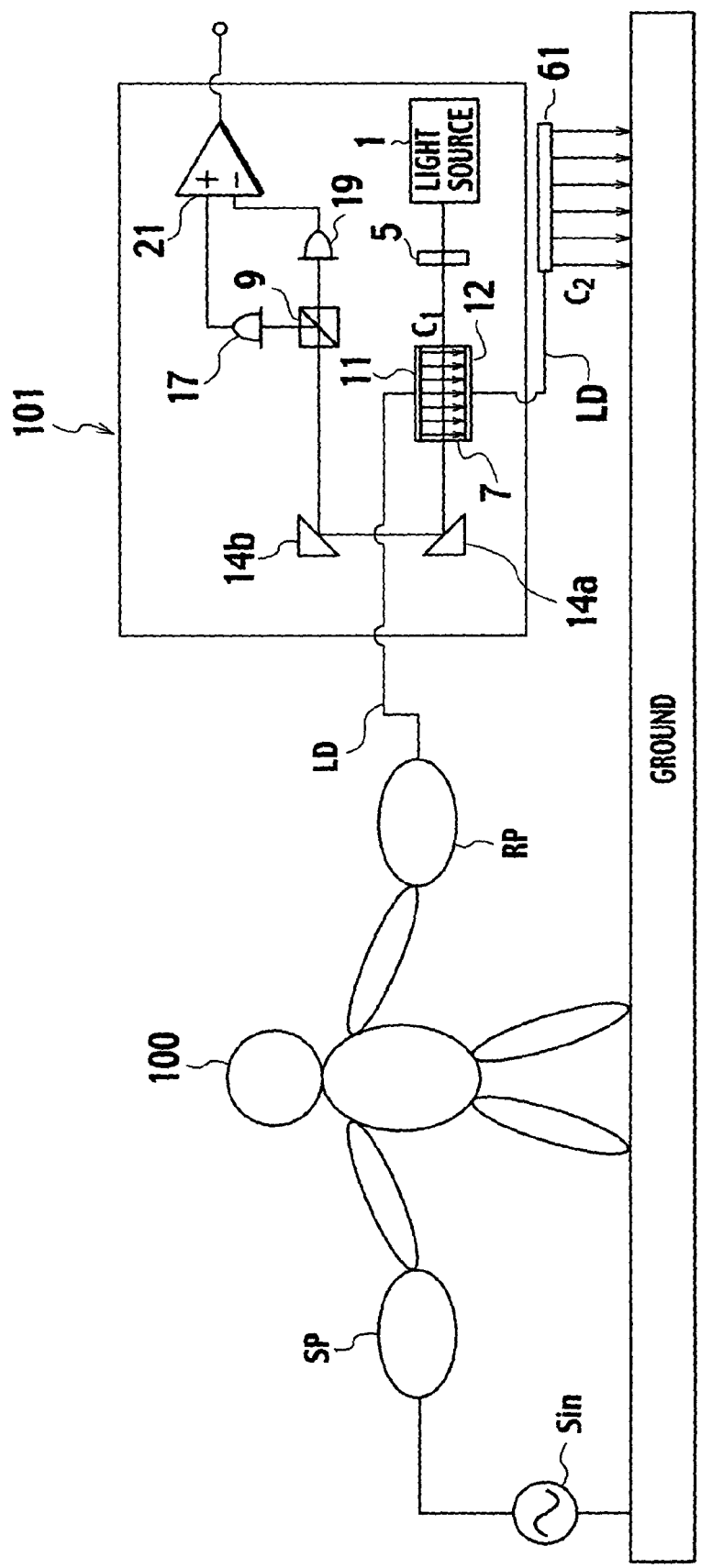
FIG. 33 is a diagram showing an example of a configuration of the electric field sensor according to the present invention that is used to detect an electric signal of a human body.
Figure 34:
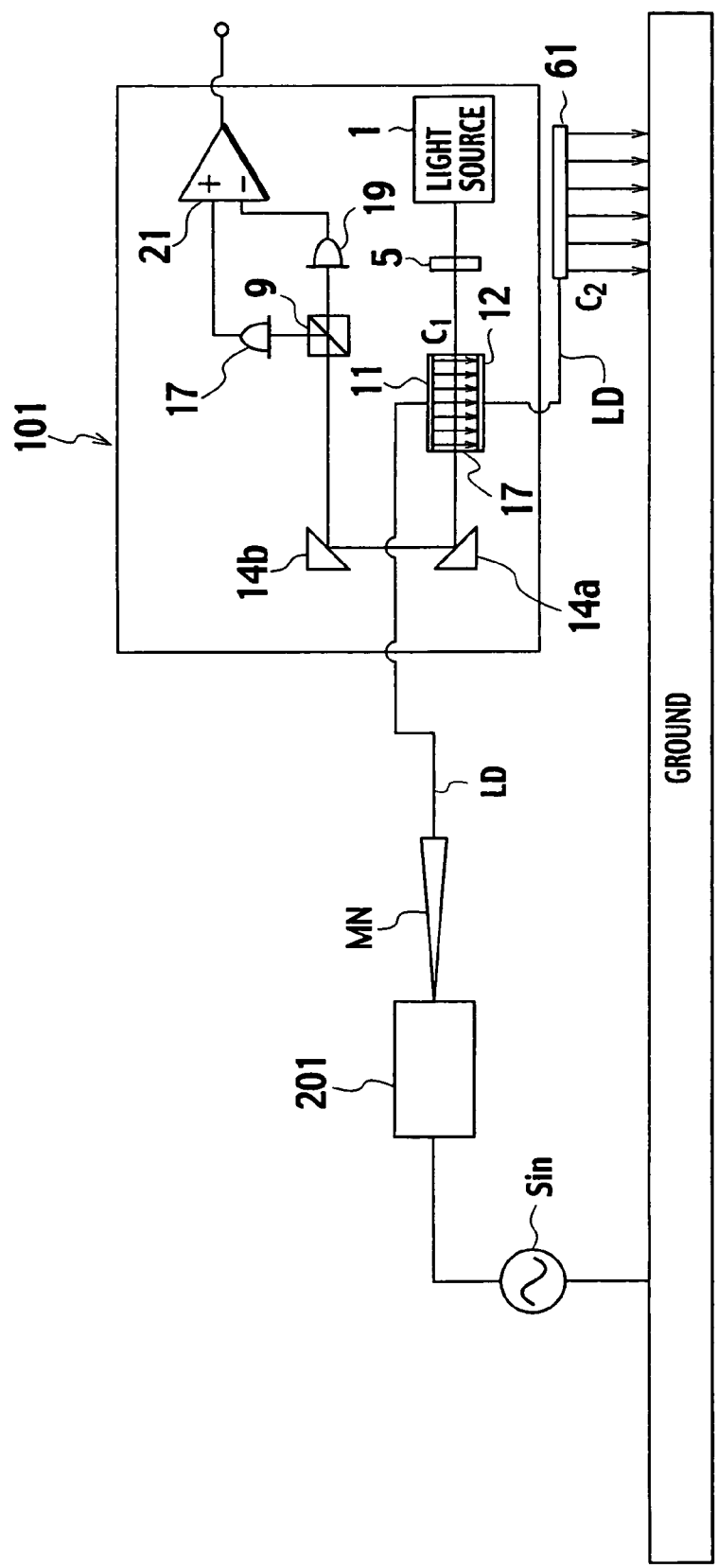
FIG. 34 is a diagram showing an example of a configuration of the electric field sensor according to the present invention that is used to measure a voltage of the DUT.

FIG. 33 is a diagram showing an example of a configuration of the electric field sensor according to the present invention that is used to detect an electric signal of a human body. FIG. 34 is a diagram showing an example of a configuration of the electric field sensor according to the present invention that is used to measure a voltage of a DUT. Constituent elements of the electric field sensor according to the present embodiment that are identical with the constituent elements of the electric field sensors shown in FIG. 5 and FIG. 6 are assigned with the same reference numerals, and explanation of these elements is omitted. In detecting the electric field within the EO crystal 7, the electric field sensor according to the present embodiment operates in the same manner as explained with reference to FIG. 5 and FIG. 6, and therefore, explanation of the operation is omitted.

According to the electric field sensors shown in FIG. 33 and FIG. 34, a counter electrode 12 as a second electrode is provided on the surface of the EO crystal 7 opposite to the surface on which the signal electrode 11 as a first electrode is provided. An auxiliary electrode 61 that increases the sensitivity of the electric field sensor is connected to the counter electrode 12 with a lead wire LD.

The second electrode may be provided on the same surface as that on which the signal electrode 11 is provided (a slot electrode configuration in an EO modulator having a waveguide configuration), or may be provided on the surface next to the surface on which the signal electrode 11 is provided.

The auxiliary electrode 61 is insulated from all parts and all circuits (circuits that drive the differential amplifier 21 and the light source 1, etc.) within the electric field sensor and from the casing of the electric field sensor. The counter electrode 12 and the auxiliary electrode 61 are separated from each other with a larger distance than a distance between the signal electrode 11 and the counter electrode 12. The reason for the different distances is described later.

According to the electric field sensors shown in FIG. 33 and FIG. 34, the signal electrode 11 and the counter electrode 12 form a capacitor C1, and the auxiliary electrode 61 and the ground form a capacitor C2. Therefore, lines of electric force are concentrated to between the electrodes of the respective capacitors. As a result, the amplitude of the electric field within the EO crystal 7 can be increased, thereby increasing the sensitivity of the electric field sensor.

When $\phi$ denotes a potential difference between the signal electrode 11 and the ground, C1 denotes electrostatic capacitance of the capacitor C1, C2 denotes electrostatic capacitance of the capacitor C2, $\phi_1$ denotes a potential difference between the electrodes of the capacitor C1, and $\phi_2$ denotes a potential difference between the electrodes of the capacitor C2, the following two expressions are established:

$$\phi_1 = \phi \cdot C2/(C1+C2)$$

$$\phi_2 = \phi \cdot C1/(C1+C2)$$

The amplitude of the electric field within the EO crystal 7 is proportional to the potential difference $\phi 1$ between the electrodes of the capacitor C1. Therefore, in order to increase the amplitude of the electric field within the EO crystal 7, the electric field sensor is designed to satisfy a relationship of the electrostatic capacitance C2>C1 (preferably, C2>>C1).

Since the EO crystal 7 is usually very small, the sensitivity can be increased by only providing the counter electrode 12 and the auxiliary electrode 61. In order to further increase the sensitivity by further increasing the electrostatic capacitance C2, the front surface area of the auxiliary electrode 61 is increased, for example. When the auxiliary electrode 61 has a bar shape (including a string shape), a tabular shape, or a spherical shape (including a semispherical shape), the front surface area can be increased without affecting manufacture of the auxiliary electrode.

Figure 35:
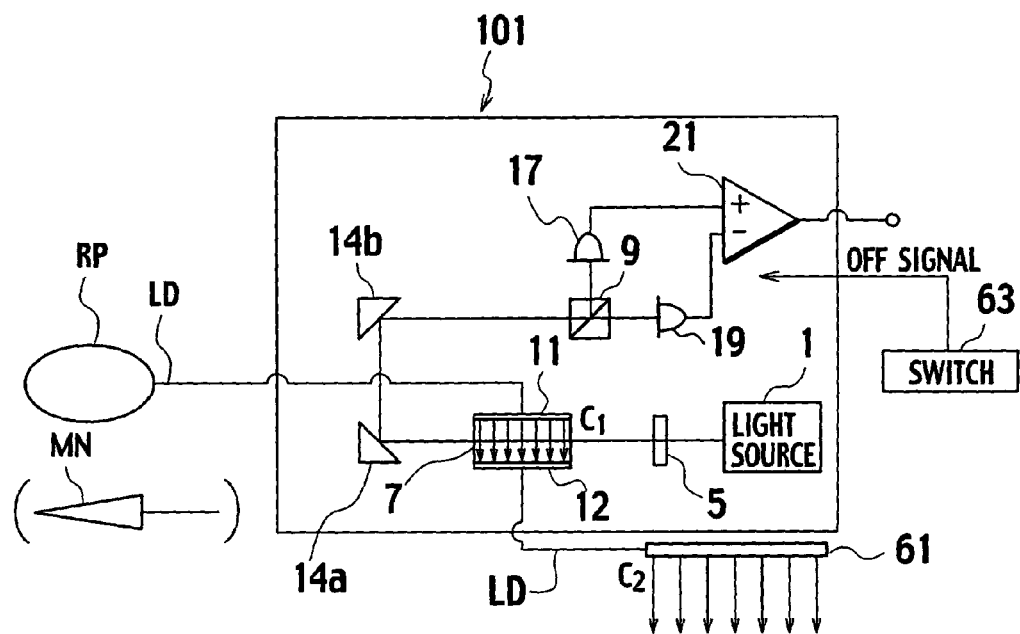
FIG. 35 is a diagram showing a state in which an auxiliary electrode is provided near a signal electrode and a counter electrode.
Figure 36:
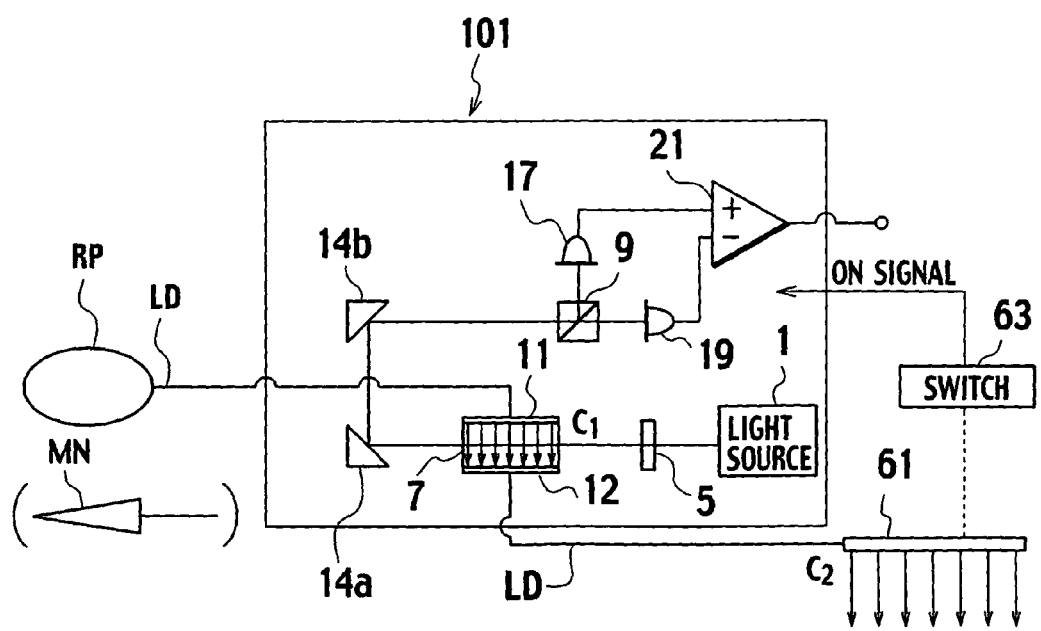
FIG. 36 is a diagram showing a state in which the auxiliary electrode is provided with a distance from the signal electrode and the counter electrode.

In order to increase the electrostatic capacitance C2, the auxiliary electrode 61 is set far from the signal electrode 11 and the counter electrode 12 as shown in FIG. 36, instead of providing the auxiliary electrode 61 near the signal electrode 11 and the counter electrode 12 as shown in FIG. 35. Preferably, the auxiliary electrode 61 is set closer to the ground. When the auxiliary electrode 61 is set far from the electric field sensor, it becomes difficult to handle the electric field sensor. Therefore, it is preferable that the electrodes are connected to each other with an elastic member, thereby setting a variable distance between the counter electrode 12 and the auxiliary electrode 61. Alternatively, the auxiliary electrode 61 may be accommodated in a casing, like the antenna of a portable telephone.

When the auxiliary electrode 61 is near the signal electrode 11 and the counter electrode 12, the sensitivity of detecting the electric field becomes low. Therefore, a switch mechanism is preferably provided so that the auxiliary electrode 61 operates only when the auxiliary electrode 61 is set with a distance from the counter electrode 12. For example, when the auxiliary electrode 61 is near the counter electrode 12, power supply to the light source 1, the photo detectors 17 and 19, and the differential amplifier 21 is interrupted. When the counter electrode 12 and the auxiliary electrode 61 are separated from each other by a predetermined distance or more, power is supplied to the light source 1, the photo detectors 17 and 19, and the differential amplifier 21.

Specifically, the following mechanism may be provided. As shown in FIGS. 35 and 36, the auxiliary electrode 61 is set movable along a rail. A switch 63 is provided on this rail. When the auxiliary electrode 61 moves to a direction away from the counter electrode 12 and passes above the switch 63, the switch 63 is turned on to supply power. On the other hand, when the auxiliary electrode 61 moves to a direction closer to the counter electrode 12 and passes above the switch 63, the switch 63 is turned off to interrupt the power supply. Alternatively, the following mechanism may be provided. The auxiliary electrode 61 can be fixed to a position A that is separated from the counter electrode 12 by a predetermined distance or more or to a position B that is very close to the counter electrode 12. At the same time, a switch is provided at the position A. When the auxiliary electrode 61 is fixed to the position A, the switch is turned on to supply power. On the other hand, when the auxiliary electrode 61 is fixed to the position B, the switch at the position A is turned off to interrupt the power supply.

By providing the above mechanism, an electric field sensor that can always detect in high sensitivity can be realized.

INDUSTRIAL APPLICABILITY

According to the electric field sensor of the present invention, a reduction in the sensitivity of the electro optic crystal attributable to a natural birefringent index can be compensated for.

According to the present invention, a reflected light in a circularly polarized state is converted into a P polarized light or an S polarized light. A polarizing beam splitter or the like removes this polarized light. Therefore, the electric field sensor that can prevent a reflected light from entering a laser light source can be provided.

According to the electric field sensor of the present invention, there are provided a second electrode that is disposed on an electro optic crystal, and an auxiliary electrode that is electrically connected to the second electrode and can be separated from the second electrode with a sufficient distance. Therefore, the amplitude of the electric field within the electro optic crystal increases, and the sensitivity of the electric field sensor can be increased accordingly.

The invention claimed is:

1. An electric field sensor comprising:

a light source;

an electro optic crystal which is applied with an electric field based on a signal under test, in which a birefringent index changes according to the electric field, and which changes a polarization state of light incident from said light source according to the birefringent index and emits the light;

a detector that detects an electric signal according to the change of the polarization state of the light emitted from said electro optic crystal;

a first electrode that is provided close to said electro optic crystal, and that applies the electric field based on the signal under test to said electro optic crystal;

a second electrode that is provided close to said electro optic crystal, thereby forming a pair with said first electrode; and an auxiliary electrode that is electrically connected to said second electrode, wherein, a first capacitance between said auxiliary electrode and a ground is larger than a second capacitance between said first electrode and said second electrode, the first capacitance and the second capacitance being arranged in series.

2. The electric field sensor according to claim 1, wherein a surface area of said auxiliary electrode is larger than each surface area of said first electrode and said second electrode.

3. The electric field sensor according to claim 2, wherein a shape of said auxiliary electrode is any one of a bar shape, a tabular shape, and a spherical shape.

4. The electric field sensor according to claim 1, wherein a distance between said auxiliary electrode and said second electrode is larger than a distance between said first electrode and said second electrode.

5. The electric field sensor according to claim 1, further comprising distance changing means for changing a distance between said auxiliary electrode and said second electrode by moving said auxiliary electrode.

6. The electric field sensor according to claim 5, further comprising control means for controlling said detector to operate when said distance changing means separates said auxiliary electrode from said second electrode by a predetermined distance or more.

7. The electric field sensor according to claim 1, wherein said auxiliary electrode is insulated from a circuit that constitutes said detector and a circuit that drives said light source.

* * * * *